(12) United States Patent
Carman

(10) Patent No.: US 7,924,630 B2
(45) Date of Patent: Apr. 12, 2011

(54) TECHNIQUES FOR SIMULTANEOUSLY DRIVING A PLURALITY OF SOURCE LINES

(75) Inventor: Eric Carman, Cernex (FR)

(73) Assignee: Micron Technology, Inc., Boise, ID (US)

( * ) Notice: Subject to any disclaimer, the term of this patent is extended or adjusted under 35 U.S.C. 154(b) by 196 days.

(21) Appl. No.: 12/251,944

(22) Filed: Oct. 15, 2008

(65) Prior Publication Data

US 2010/0091586 A1    Apr. 15, 2010

(51) Int. Cl.
- *G11C 7/10* (2006.01)
- *G11C 5/06* (2006.01)
- *G11C 7/00* (2006.01)
- *G11C 8/00* (2006.01)

(52) U.S. Cl. ............... 365/189.04; 365/63; 365/220; 365/230.03

(58) Field of Classification Search ............ 365/63, 365/189.04, 220, 230.03
See application file for complete search history.

(56) References Cited

U.S. PATENT DOCUMENTS

| | | |
|---|---|---|
| 3,439,214 A | 4/1969 | Kabell |
| 3,997,799 A | 12/1976 | Baker |
| 4,032,947 A | 6/1977 | Kesel et al. |
| 4,250,569 A | 2/1981 | Sasaki et al. |
| 4,262,340 A | 4/1981 | Sasaki et al. |
| 4,298,962 A | 11/1981 | Hamano et al. |
| 4,371,955 A | 2/1983 | Sasaki |
| 4,527,181 A | 7/1985 | Sasaki |
| 4,630,089 A | 12/1986 | Sasaki et al. |
| 4,658,377 A | 4/1987 | McElroy |
| 4,791,610 A | 12/1988 | Takemae |
| 4,807,195 A | 2/1989 | Busch et al. |
| 4,954,989 A | 9/1990 | Auberton-Herve et al. |
| 4,979,014 A | 12/1990 | Hieda et al. |
| 5,010,524 A | 4/1991 | Fifield et al. |
| 5,144,390 A | 9/1992 | Matloubian |
| 5,164,805 A | 11/1992 | Lee |

(Continued)

FOREIGN PATENT DOCUMENTS

CA            272437            7/1927

(Continued)

OTHER PUBLICATIONS

Cho et al., "Novel DRAM Cell with Amplified Capacitor for Embedded Application", IEEE, Jun. 2009.

(Continued)

*Primary Examiner* — Ly D Pham
(74) *Attorney, Agent, or Firm* — Hunton & Williams, LLP

(57) ABSTRACT

Techniques for simultaneously driving a plurality of source lines are disclosed. In one particular exemplary embodiment, the techniques may be realized as an apparatus for simultaneously driving a plurality of source lines. The apparatus may include a plurality of source lines coupled to a single source line driver. The apparatus may also include a plurality of dynamic random access memory cells arranged in an array of rows and columns, each dynamic random access memory cell including one or more memory transistors. Each of the one or more memory transistors may include a first region coupled to a first source line of the plurality of source lines, a second region coupled to a bit line, a body region disposed between the first region and the second region, wherein the body region may be electrically floating, and a gate coupled to a word line and spaced apart from, and capacitively coupled to, the body region.

15 Claims, 13 Drawing Sheets

U.S. PATENT DOCUMENTS

| | | | |
|---|---|---|---|
| 5,258,635 A | 11/1993 | Nitayama et al. |
| 5,313,432 A | 5/1994 | Lin et al. |
| 5,315,541 A | 5/1994 | Harari et al. |
| 5,350,938 A | 9/1994 | Matsukawa et al. |
| 5,355,330 A | 10/1994 | Hisamoto et al. |
| 5,388,068 A | 2/1995 | Ghoshal et al. |
| 5,397,726 A | 3/1995 | Bergemont et al. |
| 5,432,730 A | 7/1995 | Shubat et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,515,383 A | 5/1996 | Katoozi |
| 5,526,307 A | 6/1996 | Yiu et al. |
| 5,528,062 A | 6/1996 | Hsieh et al. |
| 5,568,356 A | 10/1996 | Schwartz |
| 5,583,808 A | 12/1996 | Brahmbhatt |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,677,867 A | 10/1997 | Hazani |
| 5,696,718 A | 12/1997 | Hartmann |
| 5,740,099 A | 4/1998 | Tanigawa |
| 5,774,411 A | 6/1998 | Hsieh et al. |
| 5,778,243 A | 7/1998 | Aipperspach et al. |
| 5,780,906 A | 7/1998 | Wu et al. |
| 5,784,311 A | 7/1998 | Assaderaghi et al. |
| 5,798,968 A | 8/1998 | Lee et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 5,986,914 A | 11/1999 | McClure |
| 6,018,172 A | 1/2000 | Hidada et al. |
| 6,048,756 A | 4/2000 | Lee et al. |
| 6,081,443 A | 6/2000 | Morishita |
| 6,096,598 A | 8/2000 | Furukawa et al. |
| 6,097,056 A | 8/2000 | Hsu et al. |
| 6,111,778 A | 8/2000 | MacDonald et al. |
| 6,121,077 A | 9/2000 | Hu et al. |
| 6,133,597 A | 10/2000 | Li et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,708 B1 | 1/2001 | Kuang et al. |
| 6,214,694 B1 | 4/2001 | Leobandung et al. |
| 6,222,217 B1 | 4/2001 | Kunikiyo |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,333,866 B1 | 12/2001 | Ogata |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,432,769 B1 | 8/2002 | Fukuda et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,480,407 B1 | 11/2002 | Keeth |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,537,871 B2 | 3/2003 | Forbes |
| 6,538,916 B2 | 3/2003 | Ohsawa |
| 6,544,837 B1 | 4/2003 | Divakaruni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,552,932 B2 | 4/2003 | Cernea |
| 6,556,477 B2 | 4/2003 | Hsu et al. |
| 6,560,142 B1 | 5/2003 | Ando |
| 6,563,733 B2 | 5/2003 | Liu et al. |
| 6,566,177 B1 | 5/2003 | Radens et al. |
| 6,567,330 B2 | 5/2003 | Fujita et al. |
| 6,574,135 B1 | 5/2003 | Komatsuzaki |
| 6,573,566 B2 | 6/2003 | Ker et al. |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,825,524 B1 | 11/2004 | Ikehashi et al. |
| 6,861,689 B2 | 3/2005 | Burnett |
| 6,870,225 B2 | 3/2005 | Bryant et al. |
| 6,882,566 B2 | 4/2005 | Nejad et al. |
| 6,888,770 B2 | 5/2005 | Ikehashi |
| 6,894,913 B2 | 5/2005 | Yamauchi |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portmann et al. |
| 6,913,964 B2 | 7/2005 | Hsu |
| 6,936,508 B2 | 8/2005 | Visokay et al. |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 | 4/2006 | Forbes |
| 7,037,790 B2 | 5/2006 | Chang et al. |
| 7,041,538 B2 | 5/2006 | Ieong et al. |
| 7,042,765 B2 | 5/2006 | Sibigtroth et al. |
| 7,061,806 B2 | 6/2006 | Tang et al. |
| 7,085,153 B2 | 8/2006 | Ferrant et al. |
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,187,581 B2 | 3/2007 | Ferrant et al. |
| 7,230,846 B2 | 6/2007 | Keshavarzi |
| 7,233,024 B2 | 6/2007 | Scheuerlein et al. |
| 7,256,459 B2 | 8/2007 | Shino |
| 7,301,803 B2 | 11/2007 | Okhonin et al. |
| 7,301,838 B2 | 11/2007 | Waller |
| 7,324,387 B1 | 1/2008 | Bergemont et al. |
| 7,335,934 B2 | 2/2008 | Fazan |
| 7,341,904 B2 | 3/2008 | Willer |
| 7,317,641 B2 | 8/2008 | Scheuerlein |
| 7,456,439 B1 | 11/2008 | Horch |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |

| | | |
|---|---|---|
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,696,032 B2 | 4/2010 | Kim et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee |
| 2004/0029335 A1 | 2/2004 | Lee et al. |
| 2004/0075143 A1 | 4/2004 | Bae et al. |
| 2004/0108532 A1 | 6/2004 | Forbes et al. |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1* | 3/2005 | Ikehashi et al. ............... 365/222 |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0084247 A1 | 4/2006 | Liu |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin et al. |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida et al. |
| 2008/0049486 A1 | 2/2008 | Gruening-von Schwerin |
| 2008/0083949 A1 | 4/2008 | Zhu et al. |
| 2008/0099808 A1 | 5/2008 | Burnett et al. |
| 2008/0130379 A1* | 6/2008 | Ohsawa ................ 365/189.11 |
| 2008/0133849 A1 | 6/2008 | Demi et al. |
| 2008/0165577 A1 | 7/2008 | Fazan et al. |
| 2008/0253179 A1 | 10/2008 | Slesazeck |
| 2008/0258206 A1 | 10/2008 | Hofmann |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2010/0085813 A1* | 4/2010 | Shino ...................... 365/185.21 |
| 2010/0091586 A1 | 4/2010 | Carman |
| 2010/0110816 A1 | 5/2010 | Nautiyal et al. |

FOREIGN PATENT DOCUMENTS

| | | |
|---|---|---|
| EP | 0 030 856 | 6/1981 |
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 642 173 | 3/1995 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |

| | | |
|---|---|---|
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | H04-176163 A | 6/1922 |
| JP | S62-007149 A | 1/1987 |
| JP | 62-272561 | 11/1987 |
| JP | 02-294076 | 2/1991 |
| JP | 03171768 | 7/1991 |
| JP | 05-347419 | 12/1993 |
| JP | 5-347419 | 12/1993 |
| JP | 08213624 | 8/1996 |
| JP | H08-213624 A | 8/1996 |
| JP | 8-274277 | 10/1996 |
| JP | H08-316337 A | 11/1996 |
| JP | 09046688 | 2/1997 |
| JP | 9-82912 | 3/1997 |
| JP | 10242470 | 11/1998 |
| JP | 11-87649 | 3/1999 |
| JP | 247735 | 8/2000 |
| JP | 274221 | 9/2000 |
| JP | 389106 | 12/2000 |
| JP | 180633 | 6/2001 |
| JP | 2002-94027 | 3/2002 |
| JP | 2002-176154 | 6/2002 |
| JP | 2002-246571 | 8/2002 |
| JP | 2002-9081 | 11/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-31693 | 1/2003 |
| JP | 2003-68877 A | 3/2003 |
| JP | 2003-86712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | 01/24268 | 4/2001 |
| WO | 2005/008778 | 1/2005 |

OTHER PUBLICATIONS

Clarke, Junctionless Transistors Could Simply Chip Making, Say Researchers, EE Times, Feb. 2010, www.eetimes.com/showArticle. jhtml?articleID=223100050.
Colinge, Nanowire Transistors Without Junctions, Nature NanoTechnology, vol. 5, 2010, pp. 225-229.
Jeong et al., "A Capacitor-less 1T DRAM Cell Based on a Surrounding Gate MOSFET with Vertical Channel", Technology Development Team, Technology Development Team, Samsung Electronics Co., Ltd., May 2007.
Jeong et al., "A New Capacitorless 1T DRAm Cell: Surrounding Gate MOSFET with Vertical Channel (SGVC Cell)", IEEE Transactions on Nanotechnology, vol. 6, No. 3, May 2007.
Jeong et al., "Capacitorless DRAM Cell with Highly Scalable Surrounding Gate Structure", Extended Abstracts of the 2006 International Conference on Solid State Devices and Materials, pp. 574-575, Yokohama (2006).
Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).
Morishita, F. et al., "A Configurable Enhanced TTRAM Macro for System-Level Power Management Unified Memory", IEEE Journal of Solid -State Circuits, vol. 42, No. 4, pp. 853, Apr. 2007.

Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.
Schloesser et al., "A 6F2 Buried Wordline DRAM Cell for 40nm and Beyond", IEEE, Qimonda Dresden GmbH & Co., pp. 809-812 (2008).
Arimoto et al., A Configurable Enhanced T2RAM Macro for System-Level Power Management Unified Memory, 2006, VLSI Symposium.
Arimoto, A High-Density Scalable Twin Transistor RAM (TTRAM) With Verify Control for SOI Platform Memory IPs, Nov. 2007, Solid-State Circuits.
Avci, Floating Body Cell (FBC) Memory for 16-nm Technology with Low Variation on Thin Silicon and 10-nm BOX, Oct. 2008, SOI Conference.
Bae, Evaluation of 1T RAM using Various Operation Methods with SOONO (Silicon-On-ONO) device, Dec. 2008, IEDM.
Ban, A Scaled Floating Body Cell (FBC) Memory with High-k+Metal Gate on Thin-Silicon and Thin-BOX for 16-nm Technology Node and Beyond, Jun. 2008, VLSI Symposium.
Blagojevic et al., Capacitorless 1T DRAM Sensing Scheme Automatice Reference Generation, 2006, IEEE J.Solid State Circuits.
Butt, Scaling Limits of Double Gate and Surround Gate Z-RAM Cells, 2007, IEEE Trans. On El. Dev.
Cho, A novel capacitor-less DRAM cell using Thin Capacitively-Coupled Thyristor (TCCT), 2005, IEDM.
Choi et al., Current Flow Mechanism in Schottky-Barrier MOSFET and Application to the 1T-DRAM, 2008, SSDM.
Choi, High Speed Flash Memory and 1T-DRAM on Dopant Segregated Schottky Barrier (DSSB) FinFET SONOS Device for Multifunctional SoC Applications, Dec. 2008, IEDM.
Collaert et al., Optimizing the Readout Bias for the Capacitorless 1T Bulk FinFET RAM Cell, 2009, IEEE EDL.
Collaert, Comparison of scaled floating body RAM architectures, Oct. 2008, SOI Conference.
Ershov, Optimization of Substrate Doping for Back-Gate Control in SOI T-RAM Memory Technology, 2005, SOI Conference.
Ertosun et al., A Highly Scalable Capacitorless Double Gate Quantum Well Single Transistor DRAM: 1T-QW DRAM, 2008, IEEE EDL.
Fazan, A Highly Manufacturable Capacitor-less 1T-DRAM Concept, 2002, SPIE.
Fisch, Beffa, Bassin, Soft Error Performance of Z-RAM Floating Body Memory, 2006, SOI Conference.
Fisch, Carman, Customizing SOI Floating Body Memory Architecture for System Performance and Lower Cost, 2006, SAME.
Fisch, Z-RAM® Ultra-Dense Memory for 90nm and Below, 2006, Hot Chips.
Fossum et al., New Insights on Capacitorless Floating Body DRAM Cells, 2007, IEEE EDL.
Fujita, Array Architectureof Floating Body Cell (FBC) with Quasi-Shielded Open Bit Line Scheme for sub-40nm Node, 2008, SOI Conference.
Furuhashi, Scaling Scenario of Floating Body Cell (FBC) Suppressing Vth Variation Due to Random Dopant Fluctuation, Dec. 2008, SOI Conference.
Gupta et al., SPICE Modeling of Self Sustained Operation (SSO) to Program Sub-90nm Floating Body Cells, Oct. 2009, Conf on Simulation of Semiconductor Processes & Devices.
Han et al., Bulk FinFET Unified-RAM (URAM) Cell for Multifunctioning NVM and Capacitorless 1T-DRAM, 2008, IEEE EDL.
Han et al., Partially Depleted SONOS FinFET for Unified RAM (URAM) Unified Function for High-Speed 1T DRAM and Nonvolatile Memory, 2008, IEEE EDL.
Han, Energy Band Engineered Unified-RAM (URAM) for Multi-Functioning 1T-DRAM and NVM, Dec. 2008, IEDM.
Han, Parasitic BJT Read Method for High-Performance Capacitor-less 1T-DRAM Mode in Unified RAM, Oct. 2009, IEEE EDL.
Jang et al., Highly scalable Z-RAM with remarkably long data retention for DRAM application, Jun. 2009, VLSI.

Kuo et al., A Capacitorless Double Gate DRAM Technology for Sub 100 nm Embedded and Stand Alone Memory Applications, 2003, IEEE Trans. On El. Dev.

Liu et al., Surface Generation-Recombination Processes of Gate and STI Oxide Interfaces Responsible For Junction Leakage on SOI, Sep. 2009, ECS Transactions, vol. 25.

Liu, Surface Recombination-Generation Processes of Gate, STI and Buried Oxide Interfaces, Responsible for Junction Leakage, ICSI, May 19, 2009.

Lu et al., A Novel Two-Transistor Floating Body/Gate Cell for Low Power Nanoscale Embedded DRAM, 2008, IEEE Trans. On El. Dev.

Malinge, An 8Mbit DRAM Design Using a 1TBulk Cell, 2005, VLSI Circuits.

Matsuoka et al., FBC Potential of 6F2 Single Cell Operation in Multi Gbit Memories Confirmed by a Newly Developed Method for Measuring Signal Sense Margin, 2007, IEDM.

Minami, A Floating Body Cell (FBC) fully Compatible with 90nm CMOS Technology(CMOS IV) for 128Mb SOI DRAM, 2005, IEDM.

Mohapatra et al., Effect of Source/Drain Asymmetry on the Performance of Z-RAMO Devices, Oct. 2009, SOI conference.

Morishita, A Capacitorless Twin-Transistor Random Access Memory (TTRAM) on SOI, 2005, CICC.

Nagoga, Studying Of Hot Carrier Effect In Floating Body Soi Mosfets By The Transient Charge Pumping Technique, Switzerland 2003.

Nayfeh, A Leakage Current Model for SOI based Floating Body Memory that Includes the Poole-Frenkel Effect, 2008, SOI Conference.

Nemati, Embedded Volatile Memories-Embedded Tutorial: The New Memory Revolution, New Drives Circuits and Systems, ICCAD 2008, Nov. 2008.

Nemati, A Novel High Density, Low Voltage SRAM Cell with a Vertical NDR Device, 1998, VLSI Tech. Symp.

Nemati, A Novel Thyristor-based SRAM Cell (T-RAM) for High-Speed, Low-Voltage, Giga-scale Memories, 1999, IEDM Conference.

Nemati, Fully Planar 0.562µm2 T-RAM Cell in a 130nm SOI CMOS Logic Technology for High-Density High-Performance SRAMs, 2004, IEDM.

Nemati, The New Memory Revolution. New Devices, Circuits and Systems, 2008, ICCAD.

Nemati, Thyristor RAM (T-RAM): A High-Speed High-Density Embedded Memory Technology for Nano-scale CMOS, 2007, Hot Chips.

Nemati, Thyristor-RAM: A Novel Embedded Memory Technology that Outperforms Embedded S RAM/DRAM, 2008, Linley Tech Tour.

Nishiguchi et al., Long Retention of Gain-Cell Dynamic Random Access Memory with Undoped Memory Node, 2007, IEEE EDL.

Oh, Floating Body DRAM Characteristics of Silicon-On-ONO (SOONO) Devices for System-on-Chip (SoC) Applications, 2007, VLSI Symposium.

Ohsawa, A 128Mb Floating Body RAM (FBRAM) on SOI with a Multi-Averaging Scheme of Dummy Cell, 2006 Symposium of VLSI Circuits Digest of Tech Papers, (2006).

Ohsawa, An 18.5ns 128Mb SOI DRAM with a Floating Body Cell, 2005, ISSCC.

Ohsawa, Autonomous Refresh of Floating Body Cell (FBC), Dec. 2008, IEDM.

Ohsawa, Design of a 128-Mb SOI DRAM Using the Floating Body Cell (FBC), Jan. 2006, Solid-State Circuits.

Okhonin, A Capacitor-Less 1T-DRAM Cell, Feb. 2002, Electron Device Letters.

Okhonin, A SOI Capacitor-less 1T-DRAM Concept, 2001, SOI Conference.

Okhonin, Charge Pumping Effects in Partially Depleted SOI MOSFETs, 2003, SOI Conference.

Okhonin, New characterization techniques for SOI and related devices, 2003, ECCTD.

Okhonin, New Generation of Z-RAM, 2007, IEDM.

Okhonin, Principles of Transient Charge Pumping on Partially Depleted SOI MOSFETs, May 2002, Electron Device Letters.

Okhonin, Transient Charge Pumping for Partially and Fully Depleted SOI MOSFETs, 2002, SOI Conference.

Okhonin, Transient effects in PD SOI MOSFETs and potential DRAM applications, 2002, Solid-State Electronics.

Okhonin, Ultra-scaled Z-RAM cell, 2008, SOI Conference.

Okhonin, Z-RAM® (Limits of DRAM), 2009, ESSDERC.

Park, Fully Depleted Double-Gate 1T-DRAM Cell with NVM Function for High Performance and High Density Embedded DRAM, 2009, IMW.

Puget et al., 1T Bulk eDRAM using GIDL Current for High Speed and Low Power applications, 2008, SSDM.

Puget et al., Quantum effects influence on thin silicon film capacitorless DRAM performance, 2006, SOI Conference.

Puget, FDSOI Floating Body Cell eDRAM Using Gate-Induced Drain-Leakage (GIDL) Write Current for High Speed and Low Power Applications, 2009, IMW.

Ranica et al., 1T-Bulk DRAM cell with improved performances: the way to scaling, 2005, ICMTD.

Ranica, A capacitor-less DRAM cell on 75nm gate length, 16nm thin Fully Depleted SOI device for high density embedded memories, 2004, IEDM.

Ranica, A One Transistor Cell on Bulk Substrate (1T-Bulk) for Low-Cost and High Density eDRAM, 2004, VLSI Symposium.

Roy, Thyristor-Based Volatile Memory in Nano-Scale CMOS, 2006, ISSCC.

Salling et al., Reliability of Thyristor Based Memory Cells, 2009, IRPS.

Sasaki et al., Charge Pumping in SOS-MOS Transistors, 1981, IEEE Trans. On El. Dev.

Sasaki et al., Charge Pumping SOS-MOS Transistor Memory, 1978, IEDM.

Shino et al., Floating Body RAM technology and its scalability to 32 nm node and beyond, 2006, IEDM.

Shino et al., Operation Voltage Dependence of Memory Cell Characteristics in Fully Depleted FBC, 2005, IEEE Trans. On El. Dev.

Shino, Fully-Depleted FBC (Floating Body Cell) with Enlarged Signal Window and Excellent Logic Process Compatibility, 2004, IEDM.

Shino, Highly Scalable FBC (Floating Body Cell) with 25nm BOX Structure for Embedded DRAM Applications, 2004, VLSI Symposium.

Singh, A 2ns-Read-Latency 4Mb Embedded Floating-Body Memory Macro in 45nm SOI Technology, Feb. 2009, ISSCC.

Song, 55 nm Capacitor-less 1T DRAM Cell Transistor with Non-Overlap Structure, Dec. 2008, IEDM.

Villaret et al., Further Insight into the Physics and Modeling of Floating Body Capacitorless DRAMs, 2005, IEEE Trans. On El. Dev.

Wang et al., A Novel 4.5F2 Capacitorless Semiconductor Memory Device, 2008, IEEE EDL.

Yang, Optimization of Nanoscale Thyristors on SOI for High-Performance High-Density Memories, 2006, SOI Conference.

Yoshida et al., A Capacitorless 1T-DRAM Technology Using GIDL Current for Low Power and High Speed Embedded Memory, 2006, IEEE Trans. On El. Dev.

Yun et al., Analysis of Sensing Margin in SOONO Device for the Capacitor-less RAM Applications, 2007, SOI Conference.

Zhou, Physical Insights on BJT-Based 1T DRAM Cells, IEEE Electron Device Letters, vol. 30, No. 5, May 2009.

Ban et al., "Floating Body Cell with Independently-Controlled Double Gates for High Density Memory", IEEE, 4 pages, (2006).

Bawedin et al., "A Capacitorless 1T-DRAM on SOI based on Dynamic Coupling and Double-Gate Operation", IEEE Electron Device Letters, vol. 29, No. 7, pp. 795-798, Jul. 2008.

Kwon et al., "A Highly Scalable 4F2 DRAM Cell Utilizing a Doubly Gated Vertical Channel", Extended Abstracts of the International Conference on Solid State Devices and Materials, Sendai, pp. 142-143, (2009).

Ohsawa et al., "Memory Design Using a One-Transistor Gain Cell on SOI", IEEE Journal of Solid-State Circuits, vol. 37, No. 11, Nov. 2002.

Rodriguez et al., "A-RAM: Novel Capacitor-less DRAM Memory", 2 pages, date unknown.

Tang et al., "Highly Scalable Capacitorless DRAM Cell on Thin-Body with Band-Gap Engineered Source and Drain", Extended Abstracts of the International Conference on Solid State Devices and Materials, Sendai, pp. 144-145, (2009).

Wu et al., "Performance Improvement of the Capacitorless DRAM Cell with Quasi-SOI Structure Based on bul k Substrate", Extended Abstracts of the International Conference on Solid State Devices and Materials, Sendai, pp. 146-147 (2009).

"A Capacitorless Double-Gate DRAM Cell", Kuo et al., IEEE Electron Device Letters, vol. 23, No. 6, Jun. 2002, pp. 345-347.

"The Multi-Stable Behaviour of SOI-NMOS Transistors at Low Temperatures", Tack et al., Proc. 1988 SOS/SOI Technology Workshop (Sea Palms Resort, St. Simons Island, GA, Oct. 1988), p. 78.

"The Multistable Charge-Controlled Memory Effect in SOI MOS Transistors at Low Temperatures", Tack et al., IEEE Transactions on Electron Devices, vol. 37, No. 5, May 1990, pp. 1373-1382.

"Mechanisms of Charge Modulation in the Floating Body of Triple-Well nMOSFET Capacitor-less DRAMs", Villaret et al., Proceedings of the INFOS 2003, Insulating Films on Semiconductors, 13th Bi-annual Conference, Jun. 18-20, 2003, Barcelona (Spain), (4 pages).

"A Memory Using One-Transistor Gain Cell on SOI (FBC) with Performance Suitable for Embedded DRAM's", Ohsawa et al., 2003 Symposium on VLSI Circuits Digest of Technical Papers, Jun. 2003 (4 pages).

"FBC (Floating Body Cell) for Embedded DRAM on SOI", Inoh et al., 2003 Symposium on VLSI Circuits Digest of Technical Papers, Jun. 2003 (2 pages).

"Toshiba's DRAM Cell Piggybacks on SOI Wafer", Y. Hara, EE Times, Jun. 2003.

"Memory Design Using a One-Transistor Gain Cell on SOI", Ohsawa et al., IEEE Journal of Solid-State Circuits, vol. 37, No. 11, Nov. 2002, pp. 1510-1522.

"Opposite Side Floating Gate SOI FLASH Memory Cell", Lin et al., IEEE, Mar. 2000, pp. 12-15.

"Advanced TFT SRAM Cell Technology Using a Phase-Shift Lithography", Yamanaka et al., IEEE Transactions on Electron Devices, vol. 42, No. 7, Jul. 1995, pp. 1305-1313.

"Soft-Error Characteristics in Bipolar Memory Cells with Small Critical Charge", Idei et al., IEEE Transactions on Electron Devices, vol. 38, No. 11, Nov. 1991, pp. 2465-2471.

"An SOI 4 Transistors Self-Refresh Ultra-Low-Voltage Memory Cell", Thomas et al., IEEE, Mar. 2003, pp. 401-404.

"MOSFET Design Simplifies DRAM", P. Fazan, EE Times, May 14, 2002 (3 pages).

"One of Application of SOI Memory Cell—Memory Array", Lončar et al., IEEE Proc. $22^{nd}$ International Conference on Microelectronics (MIEL 2000), vol. 2, NIŠ, Serbia, May 14-17, 2000, pp. 455-458.

"A SOI Current Memory for Analog Signal Processing at High Temperature", Portmann et al., 1999 IEEE International SOI Conference, Oct. 1999, pp. 18-19.

"Chip Level Reliability on SOI Embedded Memory", Kim et al., Proceedings 1998 IEEE International SOI Conference, Oct. 1998, pp. 135-139.

"Analysis of Floating-Body-Induced Leakage Current in 0.15µ m SOI DRAM", Terauchi et al., Proceedings 1996 IEEE International SOI Conference, Oct. 1996, pp. 138-139.

"Programming and Erase with Floating-Body for High Density Low Voltage Flash EEPROM Fabricated on SOI Wafers", Chi et al., Proceedings 1995 IEEE International SOI Conference, Oct. 1995, pp. 129-130.

"Measurement of Transient Effects in SOI DRAM/SRAM Access Transistors", A. Wei, IEEE Electron Device Letters, vol. 17, No. 5, May 1996, pp. 193-195.

"In-Depth Analysis of Opposite Channel Based Charge Injection in SOI MOSFETs and Related Defect Creation and Annihilation", Sinha et al., Elsevier Science, Microelectronic Engineering 28, 1995, pp. 383-386.

"Dynamic Effects in SOI MOSFET's", Giffard et al., IEEE, 1991, pp. 160-161.

"A Simple 1-Transistor Capacitor-Less Memory Cell for High Performance Embedded DRAMs", Fazan et al., IEEE 2002 Custom Integrated Circuits Conference, Jun. 2002, pp. 99-102.

"A Novel Pattern Transfer Process for Bonded SOI Giga-bit DRAMs", Lee et al., Proceedings 1996 IEEE International SOI Conference, Oct. 1996, pp. 114-115.

"Design of a SOI Memory Cell", Stanojevic et al., IEEE Proc. 21st International Conference on Microelectronics (MIEL '97), vol. 1, NIS, Yugoslavia, Sep. 14-17, 1997, pp. 297-300.

"Effects of Floating Body on Double Polysilicon Partially Depleted SOI Nonvolatile Memory Cell", Chan et al., IEEE Electron Device Letters, vol. 24, No. 2, Feb. 2003, pp. 75-77.

"An SOI-DRAM with Wide Operating Voltage Range by CMOS/SIMOX Technology", Suma et al., 1994 IEEE International Solid-State Circuits Conference, pp. 138-139.

"A Capacitorless DRAM Cell on SOI Substrate", Wann et al., IEEE IEDM, 1993, pp. 635-638.

"The Multistable Charge Controlled Memory Effect in SOI Transistors at Low Temperatures", Tack et al., IEEE Workshop on Low Temperature Electronics, Aug. 7-8, 1989, University of Vermont, Burlington, pp. 137-141.

"High-Endurance Ultra-Thin Tunnel Oxide in MONOS Device Structure for Dynamic Memory Application", Wann et al., IEEE Electron Device Letters, vol. 16, No. 11, Nov. 1995, pp. 491-493.

"Hot-Carrier Effects in Thin-Film Fully Depleted SOI MOSFET's", Ma et al., IEEE Electron Device Letters, vol. 15, No. 6, Jun. 1994, pp. 218-220.

"Design Analysis of Thin-Body Silicide Source/Drain Devices", 2001 IEEE International SOI Conference, Oct. 2001, pp. 21-22, Kedzierski.

"SOI MOSFET on Low Cost SPIMOX Substrate", Iyer et al., IEEE IEDM, Sep. 1998, pp. 1001-1004.

"High-Performance Embedded SOI DRAM Architecture for the Low-Power Supply", Yamauchi et al., IEEE Journal of Solid-State Circuits, vol. 35, No. 8, Aug. 2000, pp. 1169-1178.

"High-Field Transport of Inversion-Layer Electrons and Holes Including Velocity Overshoot", Assaderaghi et al., IEEE Transactions on Electron Devices, vol. 44, No. 4, Apr. 1997, pp. 664-671.

"Dynamic Threshold-Voltage MOSFET (DTMOS) for Ultra-Low Voltage VLSI", Assaderaghi et al., IEEE Transactions on Electron Devices, vol. 44, No. 3, Mar. 1997, pp. 414-422.

"Hot-Carrier-Induced Degradation in Ultra-Thin-Film Fully-Depleted SOI MOSFETs", Yu et al., Solid-State Electronics, vol. 39, No. 12, 1996, pp. 1791-1794.

Hot-Carrier Effect in Ultra-Thin-Film (UTF) Fully-Depleted SOI MOSFET's, Yu et al., $54^{th}$ Annual Device Research Conference Digest (Cat. No. $96^{th}$ 8193), Jun. 1996, pp. 22-23.

"An Experimental 2-bit/Cell Storage DRAM for Macrocell or Memory-on-Logic Application", Furuyama et al., IEEE Journal of Solid-State Circuits, vol. 24, No. 2, Apr. 1989, pp. 388-393.

"A Novel Silicon-On-Insulator (SOI) MOSFET for Ultra Low Voltage Operation", Assaderaghi et al., 1994 IEEE Symposium on Low Power Electronics, pp. 58-59.

"Interface Characterization of Fully-Depleted SOI MOSFET by a Subthreshold I-V Method", Yu et al., Proceedings 1994 IEEE International SOI Conference, Oct. 1994, pp. 63-64.

"A Capacitorless Double-Gate DRAM Cell Design for High Density Applications", Kuo et al., IEEE IEDM, Feb. 2002, pp. 843-846.

"A Dynamic Threshold Voltage MOSFET (DTMOS) for Ultra-Low Voltage Operation", Assaderaghi et al., IEEE IEDM, 1994, pp. 809-812.

"A Dynamic Threshold Voltage MOSFET (DTMOS) for Very Low Voltage Operation", Assaderaghi et al., IEEE Electron Device Letters, vol. 15, No. 12, Dec. 1994, pp. 510-512.

"Studying the Impact of Gate Tunneling on Dynamic Behaviors of Partially-Depleted SOI CMOS Using BSIMPD", Su et al., IEEE Proceedings of the International Symposium on Quality Electronic Design (ISQED '02), Apr. 2002 (5 pages).

"Characterization of Front and Back Si-SiO$_2$ Interfaces in Thick- and Thin-Film Silicon-on-Insulator MOS Structures by the Charge-Pumping Technique", Wouters et al., IEEE Transactions on Electron Devices, vol. 36, No. 9, Sep. 1989, pp. 1746-1750.

"An Analytical Model for the Misis Structure in SOI MOS Devices", Tack et al., Solid-State Electronics vol. 33, No. 3, 1990, pp. 357-364.

"A Long Data Retention SOI DRAM with the Body Refresh Function", Tomishima et al., IEICE Trans. Electron., vol. E80-C, No. 7, Jul. 1997, pp. 899-904.

"Simulation of Floating Body Effect in SOI Circuits Using BSIM3SOI", Tu et al., Proceedings of Technical Papers (IEEE Cat No. 97$^{th}$ 8303), Jun. 1997, pp. 339-342.

"SOI MOSFET Design for All-Dimensional Scaling with Short Channel, Narrow Width and Ultra-thin Films", Chan et al., IEEE IEDM, 1995, pp. 631-634.

"Capacitor-Less 1-Transistor DRAM", Fazan et al., 2002 IEEE International SOI Conference, Oct. 2002, pp. 10-13.

"SOI (Silicon-on-Insulator) for High Speed Ultra Large Scale Integration", C. Hu, Jpn. J. Appl. Phys. vol. 33 (1994) pp. 365-369, Part 1, No. 1B, Jan. 1994.

"Source-Bias Dependent Charge Accumulation in P+ -Poly Gate SOI Dynamic Random Access Memory Cell Transistors", Sim et al., Jpn. J. Appl. Phys. vol. 37 (1998) pp. 1260-1263, Part 1, No. 3B, Mar. 1998.

"Suppression of Parasitic Bipolar Action in Ultra-Thin-Film Fully-Depleted CMOS-SIMOX Devices by Ar-Ion Implantation into Source/Drain Regions", Ohno et al., IEEE Transactions on Electron Devices, vol. 45, No. 5, May 1998, pp. 1071-1076.

dRAM Design Using the Taper-Isolated Dynamic RAM Cell, Leiss et al., IEEE Transactions on Electron Devices, vol. ED-29, No. 4, Apr. 1982, pp. 707-714.

"Fully Isolated Lateral Bipolar-MOS Transistors Fabricated in Zone-Melting-Recrystallized Si Films on SiO2", Tsaur et al., IEEE Electron Device Letters, vol. EDL-4, No. 8, Aug. 1983, pp. 269-271.

"Silicon-On-Insulator Bipolar Transistors", Rodder et al., IEEE Electron Device Letters, vol. EDL-4, No. 6, Jun. 1983, pp. 193-195.

"Characteristics and Three-Dimensional Integration of MOSFET's in Small-Grain LPCVD Polycrystalline Silicon", Malhi et al., IEEE Transactions on Electron Devices, vol. ED-32, No. 2, Feb. 1985, pp. 258-281.

"Triple-Well nMOSFET Evaluated as a Capacitor-Less DRAM Cell for Nanoscale Low-Cost & High Density Applications", Villaret et al., Handout at Proceedings of 2003 Silicon Nanoelectronics Workshop, Jun. 8-9, 2003, Kyoto, Japan (2 pages).

"Mechanisms of Charge Modulation in the Floating Body of Triple-Well NMOSFET Capacitor-less DRAMs", Villaret et al., Handout at Proceedings of INFOS 2003, Jun. 18-20, 2003, Barcelona, Spain (2 pages).

"Embedded DRAM Process Technology", M. Yamawaki, Proceedings of the Symposium on Semiconductors and Integrated Circuits Technology, 1998, vol. 55, pp. 38-43.

"3-Dimensional Simulation of Turn-off Current in Partially Depleted SOI MOSFETs", Ikeda et al., IEIC Technical Report, Institute of Electronics, Information and Communication Engineers, 1998, vol. 97, No. 557 (SDM97 186-198), pp. 27-34.

"Dynamic floating body control SOI CMOS for power managed multimedia ULSIs", F. Morishita et al., Proc. CICC, pp. 263-266, 1997.

"A 312-MHz 16-Mb Random-Cycle Embedded DRAM Macro With a Power-Down Data Retention Mode for Mobile Applications", F. Morishita et al., J. Solid-State Circuits, vol. 40, No. 1, pp. 204-212, 2005.

"Leakage Mechanism due to Floating Body and Countermeasure on Dynamic Retention Mode of SOI-DRAM", F. Morishita et al., Symposium on VLSI Technology Digest of Technical Papers, pp. 141-142, 1995.

"Scalability Study on a Capacitorless 1T-DRAM: From Single-gate PD-SOI to Double-gate FINDRAM", Tanaka et al., 2004 IEEE, 4 pages.

"A Design of a Capacitorless 1-T-DRAM Cell Using Gate-induced Drain Leakage (GIDL) Current for Low-Power and High-speed Embedded Memory", Yoshida et al., 2003 IEEE, 4 pages.

"A Study of High Scalable DG-FinDRAM", Yoshida et al., IEEE Electron Device Letters, vol. 26, No. 9, Sep. 2005, pp. 655-657.

"Novel Capacitorless 1T-DRAM From Single-gate PD-SOI to Double-gate FinDRAM", ATIP Scoops, May 9, 2005, 9 pages.

"A High-Speed Clamped Bit-Line Current-Mode Sense Amplifier", T. Blalock, IEEE Journal of Solid-State Circuits, vol. 26, No. 4, Apr. 1991, pp. 542-548.

"Low-Voltage Transient Bipolar Effect Induced by Dynamic Floating-Body Charging in PD/SOI MOSFETs", Pelella et al., Final Camera Ready Art, SOI Conference, Oct. 1995, 2 pages.

"Floating-Body Concerns for SOI Dynamic Random Access Memory (DRAM)", Mandelman et al, Proceedings 1996 IEEE International SOI Conference, Oct. 1996, pp. 136-137.

"An SOI voltage-controlled bipolar-MOS device", J.P. Colinge, IEEE Transactions on Electron Devices, vol. ED-34, No. 4, Apr. 1987, pp. 845-849.

Ban et al., Integration of Back-Gate Doping for 15-nm Node Floating Body Cell (FBC) Memory, Components Research, Process Technology Modeling, presented in the 2010 VLSI Symposium on Jun. 17, 2010.

Tanabe et al., A 30-ns 64-MB DRAM with Built-in-Self-Test and Self-Repair Function, IEEE Journal of Solid State Circuits, vol. 27, No. 11, Nov. 1992, pp. 1525-1533.

* cited by examiner

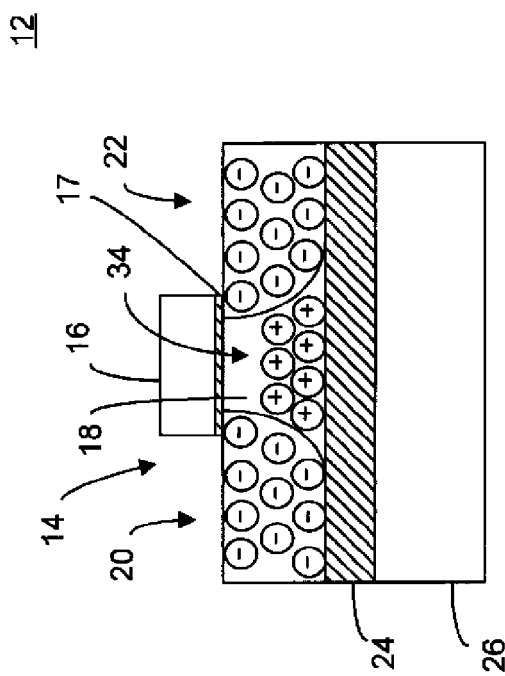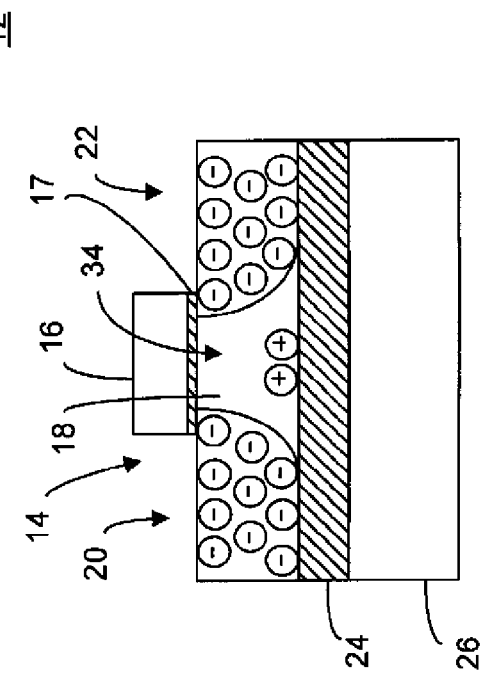

US 7,924,630 B2

TECHNIQUES FOR SIMULTANEOUSLY DRIVING A PLURALITY OF SOURCE LINES

FIELD OF THE DISCLOSURE

The present disclosure relates generally to semiconductor dynamic random access memory ("DRAM") devices and, more particularly, to techniques for simultaneously driving a plurality of source lines (SL) in a semiconductor dynamic random access memory ("DRAM") device.

BACKGROUND OF THE DISCLOSURE

There is a continuing trend to employ and/or fabricate advanced integrated circuits using techniques, materials, and devices that improve performance, reduce leakage current, and enhance overall scaling. Semiconductor-on-insulator (SOI) is a material which may be used to fabricate such integrated circuits. Such integrated circuits are known as SOI devices and may include, for example, partially depleted (PD) devices, fully depleted (FD) devices, multiple gate devices (for example, double or triple gate), and Fin-FET devices.

One example of an SOI device is a semiconductor dynamic random access memory ("DRAM") device. Such a semiconductor DRAM device may include an electrically floating body in which electrical charges may be stored. The electrical charges stored in the electrically floating body may represent a logic high or binary "1" data state or a logic low or binary "0" data state.

Various techniques may be employed to read data from and/or write data to a semiconductor DRAM device having an electrically floating body. In one conventional technique, a memory cell having a memory transistor may be read by applying a bias to a drain region of the memory transistor, as well as a bias to a gate of the memory transistor that is above a threshold voltage of the memory transistor. As such, conventional reading techniques may sense an amount of channel current provided/generated in response to the application of the bias to the gate of the memory transistor to determine a state of the memory cell. For example, an electrically floating body region of the memory cell may have two or more different current states corresponding to two or more different logical states (e.g., two different current conditions/states corresponding to two different logic states: binary "0" data state and binary "1" data state).

Also, conventional writing techniques for memory cells having an N-Channel type memory transistor typically result in an excess of majority charge carriers by channel impact ionization or by band-to-band tunneling (gate-induced drain leakage "GIDL"). The majority charge carriers may be removed via drain side hole removal, source side hole removal, or drain and source hole removal, for example, using back gate pulsing.

Often, conventional reading and writing techniques may lead to relatively large power consumption and large voltage drivers which occupy large amount of area on a circuit board or die and cause disruptions to memory cells on unselected rows of an array of memory cells. Also, pulsing between positive and negative gate biases during read and write operations may reduce a net quantity of charge carriers in an electrically floating body region of a memory cell in a semiconductor DRAM device, which, in turn, may gradually reduce, and even eliminate a net charge representing data stored in the memory cell. In the event that a negative voltage is applied to a gate of a memory cell transistor, thereby causing a negative gate bias, a channel of minority charge carriers beneath the gate may be eliminated. However, some of the minority charge carriers may remain "trapped" in interface defects. Some of the trapped minority charge carriers may recombine with majority charge carriers, which may be attracted to the gate, and a net charge associated with majority charge carriers located in the electrically floating body region may decrease over time. This phenomenon may be characterized as charge pumping, which is a problem because the net quantity of charge carriers may be reduced in an electrically floating body region of the memory cell, which, in turn, may gradually reduce, and even eliminate, a net charge representing data stored in the memory cell.

In view of the foregoing, it may be understood that there are significant problems and shortcomings associated with reading from and/or writing to electrically floating body semiconductor dynamic random access memory ("DRAM") devices using conventional reading/writing techniques.

SUMMARY OF THE DISCLOSURE

Techniques for simultaneously driving a plurality of source lines (SL) are disclosed. In one particular exemplary embodiment, the techniques may be realized as an apparatus for simultaneously driving a plurality of source lines. The apparatus may comprise a plurality of source lines coupled to a single source line driver. The apparatus may also comprise a plurality of dynamic random access memory cells arranged in an array of rows and columns, each dynamic random access memory cell including one or more memory transistors. Each of the one or more memory transistors may comprise a first region coupled to a first source line of the plurality of source lines, a second region coupled to a bit line, a body region disposed between the first region and the second region, wherein the body region may be electrically floating, and a gate coupled to a word line and spaced apart from, and capacitively coupled to, the body region.

In accordance with other aspects of this particular exemplary embodiment, a total number of source lines coupled to the source line driver may be based at least in part on power consumption of the plurality of dynamic random access memory cells.

In accordance with further aspects of this particular exemplary embodiment, a total number of source lines coupled to the source line driver may be based at least in part on disturbance on the plurality of dynamic random access memory cells.

In accordance with additional aspects of this particular exemplary embodiment, each row of the plurality of dynamic random access cells may be coupled to one source line of the plurality of source lines.

In accordance with other aspects of this particular exemplary embodiment, multiple rows of the plurality of dynamic random access memory cells may be coupled to one source line of the plurality of source lines.

In accordance with further aspects of this particular exemplary embodiment, at least one of four source lines, eight source lines, sixteen source lines, or thirty-two source lines may be coupled to the source line driver.

In accordance with additional aspects of this particular exemplary embodiment, the plurality of source lines may be divided into a plurality of sub-groups of source lines.

In accordance with yet another aspect of this particular exemplary embodiment, each of the plurality of sub-groups of source lines may be configured to perform at least one of a plurality of operations.

In accordance with other aspects of this particular exemplary embodiment, the plurality of operations may comprise at least one of a write operation, a read operation, a refresh operation, and an inhibit operation.

In accordance with further aspects of this particular exemplary embodiment, each of the plurality of sub-groups of source lines may be configured to perform different operations of the plurality of operations.

In another particular exemplary embodiment, the techniques may be realized as a method for simultaneously driving a plurality of source lines. The method may comprise coupling a plurality of source lines to a source line driver. The method may also comprise arranging a plurality of dynamic random access memory cells in an array of rows and columns, each dynamic random access memory cell including one or more memory transistors. Each of the one or more transistors may comprise a first region coupled to a first source line of the plurality of source lines, a second region coupled to a bit line, a body region disposed between the first region and the second region, wherein the body region is electrically floating, and a gate coupled to a word line and spaced apart from, and capacitively coupled to, the body region.

In accordance with other aspects of this particular exemplary embodiment, the method for simultaneously driving a plurality of source lines may further comprise coupling each row of the plurality of dynamic random access cells to one source line of the plurality of source lines.

In accordance with additional aspects of this particular exemplary embodiment, the method for simultaneously driving a plurality of source lines may further comprise coupling multiple rows of the plurality of dynamic random access memory cells to one source line of the plurality of source lines.

In accordance with another aspect of this particular exemplary embodiment, coupling a plurality of source lines to a source line driver may comprise coupling at least one of four source lines, eight source lines, sixteen source lines, or thirty-two source lines to the source line driver.

In accordance with other aspects of this particular exemplary embodiment, the plurality of source lines may be divided into a plurality of sub-groups of source lines.

In accordance with further aspects of this particular exemplary embodiment, each of the plurality of sub-groups of source lines may be configured to perform at least one of a plurality of operations.

In accordance with additional aspects of this particular exemplary embodiment, the plurality of operations may comprise at least one of a write operation, a read operation, a refresh operation, and an inhibit operation.

In accordance with another aspect of this particular exemplary embodiment, each of the plurality of sub-groups of source lines may be configured to perform different operations of the plurality of operations.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIGS. 2A and 2B show charge relationships, for given data states, of a memory cell in accordance with an embodiment of the present disclosure.

DETAILED DESCRIPTION OF EXEMPLARY EMBODIMENTS

There are many embodiments described and illustrated herein. In one aspect, the present disclosure is directed to a combination of reading/writing methods which comprise simultaneously driving a plurality of source lines (SL). Also, the present disclosure is directed to providing a relatively high voltage when reading from and/or writing to memory cells so as to reduce disruptions to unselected memory cells and increase retention time.

Figure 1A:
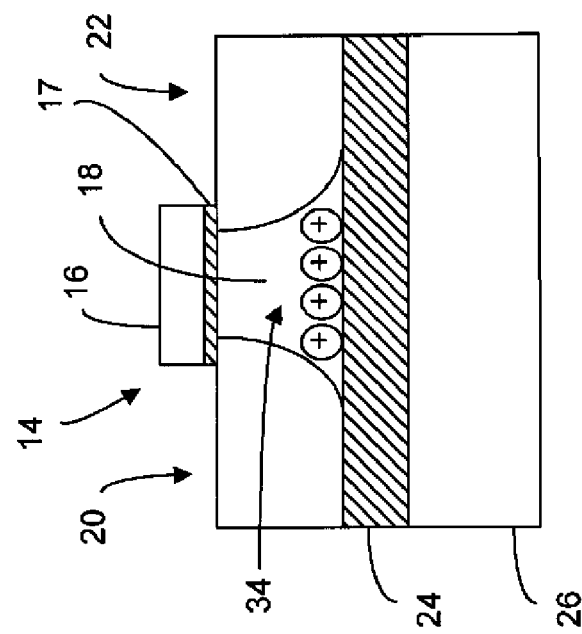
FIG. 1A shows a cross-sectional view of a memory cell in accordance with an embodiment of the present disclosure.

Referring to FIG. 1A, there is a shown a cross-sectional view of a memory cell 12 in accordance with an embodiment of the present disclosure. The memory cell 12 may comprise a memory transistor 14 (e.g., an N-channel type transistor or a P-channel type transistor) including a source region 20, a drain region 22, and an electrically floating body region 18 disposed between the source region 20 and the drain region 22. Charge carriers 34 may be accumulated in or may be emitted/ejected from the electrically floating body region 18. A data state of the memory cell 12 may be defined by an amount of charge carriers 34 present in the electrically floating body region 18.

The memory transistor 14 may also include a gate 16 disposed over the electrically floating body region 18. An insulating film 17 may be disposed between the gate 16 and the electrically floating body region 18. Moreover, the electrically floating body region 18 may be disposed on or above region 24, which may be an insulation region (e.g., in an SOI material/substrate) or a non-conductive region (e.g., in a bulk-type material/substrate). The insulation or non-conductive region 24 may be disposed on a substrate 26.

Figure 1B:
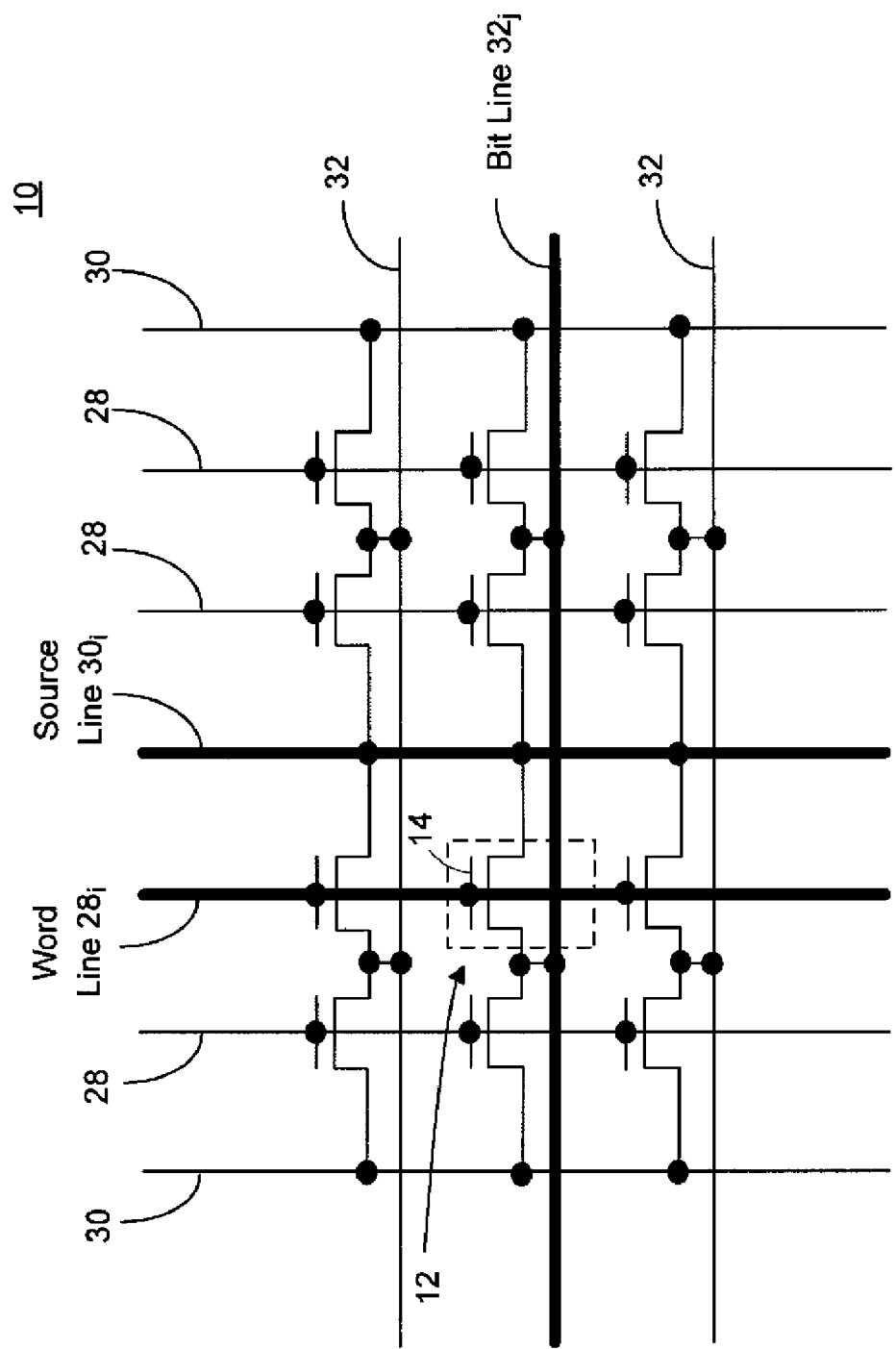
FIG. 1B shows a schematic representation of a portion of a semiconductor DRAM device including a plurality of memory cells arranged in arrays of rows and columns in accordance with an embodiment of the present disclosure.

Referring to FIG. 1B, there is shown a schematic representation of a portion 10 of a semiconductor DRAM device including a plurality of memory cells 12 arranged in an array of rows and columns in accordance with an embodiment of the present disclosure. The semiconductor DRAM device portion 10 also includes a plurality of word lines 28 (WL), a plurality of source lines 30 (SL), and a plurality of bit lines 32 (BL), each electrically coupled to corresponding ones of the plurality of memory cells 12. Each memory cell 12 may include a memory transistor 14, as described above with reference to FIG. 1A, wherein the memory transistor 14 may include a source region 20 coupled to an associated source line 30 (SL), a drain region 22 coupled to an associated bit line 32 (BL), and an electrically floating body region 18 disposed between the source region 20 and the drain region 22. The memory transistor 14 may also include a gate 16 disposed over the electrically floating body region 18 and coupled to an associated word line 28 (WL). In an exemplary embodiment, the source region 20 of the memory transistor 14 of each memory cell 12 of a first row of memory cells 12 may be coupled to a first source line 30 (SL). Also, the source region 20 of the memory transistor 14 of each memory cell 12 of a second row of memory cells 12 may be coupled to the first source line 30 (SL). In another exemplary embodiment, the source region 20 of the memory transistor 14 of each memory cell 12 of a second row of memory cells 12 may be coupled to a second source line 30 (SL), and the source region 20 of the memory transistor 14 of each memory cell 12 of a third row of memory cells may be coupled to a third source line 30 (SL).

Data may be written into a selected memory cell 12 of the semiconductor DRAM device portion 10 by applying suitable control signals to a selected word line 28, a selected source line 30, and/or a selected bit line 32. The memory cell 12 may exhibit (1) a first data state which is representative of a first amount of charge carriers 34 in the electrically floating body region 18 of the memory transistor 14, and (2) a second data state which is representative of a second amount of charge carriers 34 in the electrically floating body region 18 of the memory transistor 14. Additional data states are also possible.

The semiconductor DRAM device portion 10 may further include data write circuitry (not shown), coupled to the memory cell 12, to apply (i) first write control signals to the memory cell 12 to write the first data state therein and (ii) second write control signals to the memory cell 12 to write the second data state therein. In response to the first write control signals applied to the memory cell 12, the memory transistor 14 may generate a first transistor current which may substantially provide a first charge in the electrically floating body region 18 of the memory transistor 14. In this case, charge carriers 34 may accumulate in or may be emitted/ejected from the electrically floating body region 18. As discussed above, a data state may be defined by an amount of charge carriers 34 present in the electrically floating body region 18. For example, the amount of charge carriers 34 present in the electrically floating body region 18 may represent a logic high (i.e., binary "1" data state) or a logic low (i.e., binary "0" data state). Additional data states are also possible.

The first write control signals may include a signal applied to the gate 16 and a signal applied to the source region 20, wherein the signal applied to the source region 20 may include a first voltage potential having a first amplitude and a second voltage potential having a second amplitude. In another exemplary embodiment, the first write control signals may include a signal applied to the gate 16 and a signal applied to the drain region 22, wherein the signal applied to the drain region 22 may include a third voltage potential having a third amplitude and a fourth voltage potential having a fourth amplitude.

Also, the second write signals may include a signal applied to the gate 16, a signal applied to the source region 20, and a signal applied to the drain region 22. The signal applied to the drain region 22 may include a block voltage potential to prevent the first data state and second data state from being written into the memory transistor 14.

Referring to FIGS. 2A and 2B, there are shown charge relationships, for given data states, of the memory cell 12 in accordance with an embodiment of the present disclosure. In an exemplary embodiment, each memory cell 12 of the semiconductor DRAM device portion 10 may operate by accumulating or emitting/ejecting majority charge carriers 34 (e.g., electrons or holes) in/from the electrically floating body region 18. FIGS. 2A and 2B illustrate this with an N-Channel memory transistor 14. More specifically, various write techniques may be employed to accumulate majority charge carriers 34 (in this example, holes) in the electrically floating body region 18 of the memory cell 12 by, for example, impact ionization near the source region 20 and/or drain region 22 (see FIG. 2A). Also, the majority charge carriers 34 may be emitted or ejected from the electrically floating body region 18 by, for example, forward biasing a junction between the source region 20 and the electrically floating body region 18 and/or a junction between the drain region 22 and the electrically floating body region 18 (see FIG. 2B).

As shown in FIG. 2A, a logic high (binary "1" 1 data state) may correspond to an increased concentration of majority charge carriers 34 in the electrically floating body region 18 relative to an unwritten memory cell 12 and/or a memory cell 12 that is written with a logic low (binary "0" data state). In contrast, as shown in FIG. 2B, a logic low (binary "0" data state) may correspond to a reduced concentration of majority charge carriers 34 in the electrically floating body region 18 relative to an unwritten memory cell 12 and/or a memory cell 12 that is written with a logic high (binary "1" data state).

The semiconductor DRAM device portion 10 may further include data sense circuitry (not shown), coupled to the memory cell 12, to sense a data state of the memory cell 12. More specifically, in response to read control signals applied to the memory cell 12, the memory transistor 14 may generate a second transistor current that is representative of a data state of the memory cell 12. The data sense circuitry may determine a data state of the memory cell 12 based at least substantially on the second transistor current.

The read control signals may include signals applied to the gate 16, source region 20, and drain region 22 to cause, force, and/or induce the second transistor current, which is representative of a data state of the memory cell 12. The read control signals applied to the gate 16, source region 20, and drain region 22 may include a positive voltage or a negative voltage. One or more of the read control signals may include a constant or unchanging voltage amplitude.

Figure 3:
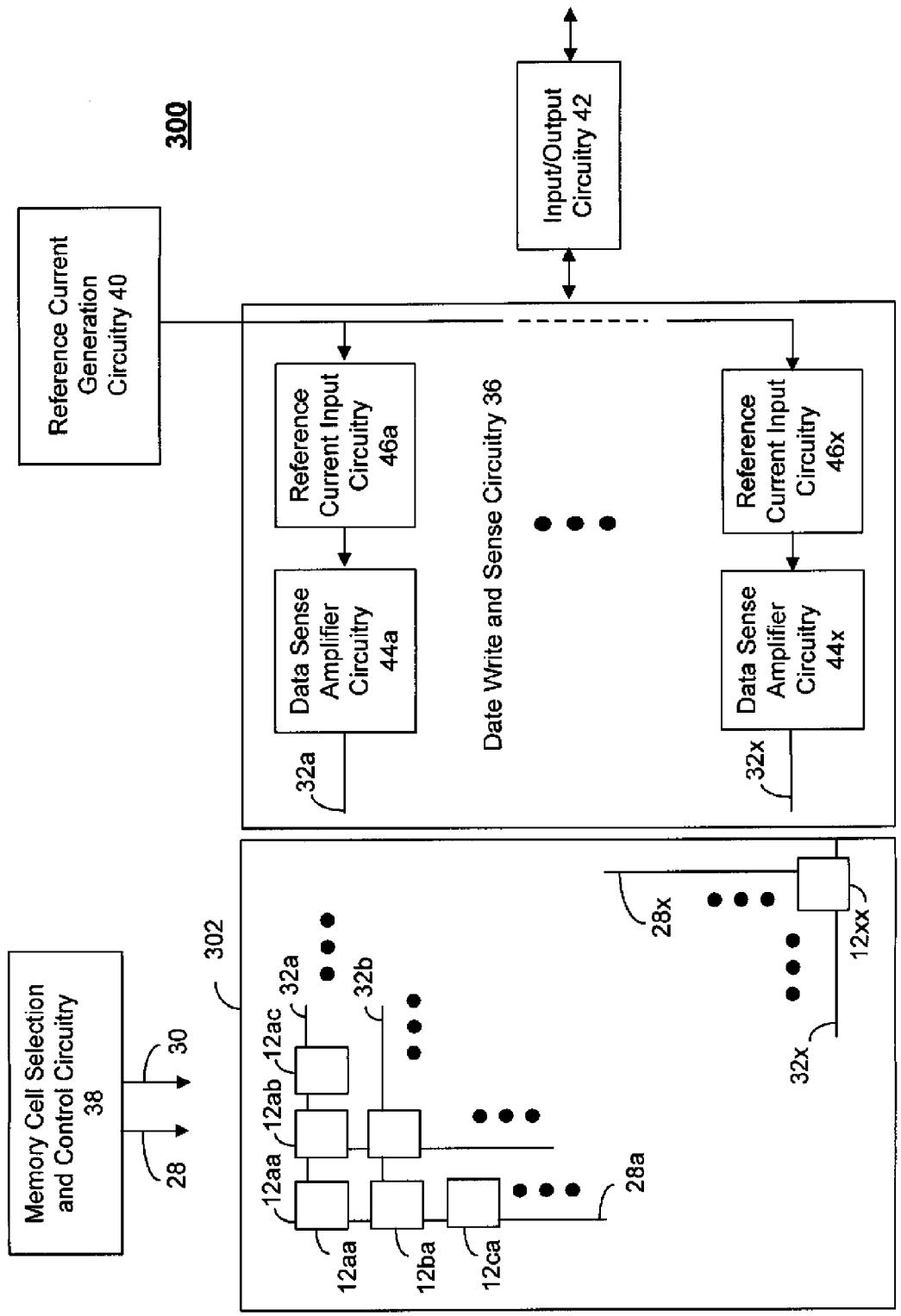
FIG. 3 shows schematic a block diagram of a semiconductor DRAM device in accordance with an embodiment of the present disclosure.

Referring to FIG. 3, there is shown a schematic block diagram of a semiconductor DRAM device 300 in accordance with an embodiment of the present disclosure. The semiconductor DRAM device 300 may include a memory cell array 302, data write and sense circuitry 36, memory cell selection and control circuitry 38, reference current generation circuitry 40, and input/output circuitry 42. The memory cell array 302 may include a plurality of memory cells 12 arranged in a matrix of rows and columns including a plurality of word lines 28 (WL), a plurality of source lines 30 (SL), and a plurality of bit lines 32 (BL). The memory cell array 302 may be coupled to the memory cell selection and control circuitry 38 via the word lines 28 (WL) and/or the source lines 30 (SL). Also, the memory cell array 302 may be coupled to the data write and sense circuitry 36 via the bit lines 32 (BL).

In an exemplary embodiment, the data write and sense circuitry 36 may include a plurality of data sense amplifier circuitry 44 and a plurality of reference current input circuitry 46. Each data sense amplifier circuitry 44 may receive at least one bit line (BL) 32 and the output of reference current generator circuitry 40 (for example, a current or voltage reference signal) via a corresponding reference current input circuitry 46. For example, each data sense amplifier circuitry 44 may be a cross-coupled type of sense amplifier to detect, determine, sense, and/or sample a data state of a memory cell 12. Each data sense amplifier circuitry 44 may detect a data state of one or more memory cells 12 (e.g., along bit lines $32a$-$32x$ (BEL)) by comparing voltages or currents on a bit line (BL) 32 with voltages or currents of the output of the reference current generator circuitry 40. Also, a predetermined voltage may be applied to the bit lines 32 (BL) based at least in part on a data state determined by the data sense amplifier circuitry 44 to write-back the data state into memory cell 12.

The data sense amplifier circuitry 44 may employ voltage and/or current sensing circuitry and/or techniques. In an exemplary embodiment, the data sense amplifier circuitry 44 may employ a current sensing circuitry and/or techniques, the current sense amplifier circuitry 44 may compare the current from the selected memory cell 12 to a reference current from the reference current input circuitry 46, for example, the current of one or more reference cells. From that comparison, it may be determined whether memory cell 12 contained a logic high (binary "1" data state, relatively more majority charge carriers 34 contained within the body region 18) or a logic low (binary "0" data state, relatively less majority charge carriers 34 contained within the body region 18). It may be appreciated by one having ordinary skill in the art, any type or form of data write and sense circuitry 36 (including one or more sense amplifiers, using voltage or current sensing techniques, to sense the data state stored in memory cell 12) to read the data stored in memory cells 12 and/or write data in memory cells 12 may be employed.

The memory cell selection and control circuitry 38 may select and/or enable one or more predetermined memory cells 12 to facilitate reading data therefrom and/or writing data thereto by applying control signals on one or more word lines 28 (WL) and/or source lines 30 (SL). The memory cell selection and control circuitry 38 may generate such control signals using address data, for example, row address data. Moreover, memory cell selection and control circuitry 38 may include a word line decoder and/or driver (not shown). For example, memory cell selection and control circuitry 38 may include one or more different control/selection techniques (and circuitry therefor) to implement the memory cell selection technique. Such techniques, and circuitry therefor, are well known to those skilled in the art. Notably, all such control/selection techniques, and circuitry therefor, whether now known or later developed, are intended to fall within the scope of the present disclosures.

In an exemplary embodiment, the semiconductor DRAM device 300 may implement a two step write operation whereby all the memory cells 12 of a given row are written to a predetermined data state by first executing a "clear" operation, whereby all of the memory cells 12 of the given row may be written to logic low (binary "0" data state) and thereafter selected memory cells 12 of the row may be selectively written to the predetermined data state (here logic high (binary "1" data state)). The present disclosure may also be implemented in conjunction with a one step write operation whereby selective memory cells 12 of the selected row are selectively written to either logic high (binary "1" data state) or logic low (binary "0" data state) without first implementing a "clear" operation.

The memory cell array 10 may employ any of the exemplary writing, holding, and/or reading techniques described herein. Moreover, exemplary voltage values for each of the control signals for a given operation (for example, writing, holding or reading), according to exemplary embodiments of the present disclosure, is also provided.

The memory transistors 14 may be comprised of N-channel, P-channel and/or both types of transistors. Indeed, circuitry that is peripheral to the memory array (for example, sense amplifiers or comparators, row and column address decoders, as well as line drivers (not illustrated herein) may include P-channel and/or N-channel type transistors. In the event that P-channel type transistors are employed as memory transistors 14 in the memory cell(s) 12, suitable write and read voltages (for example, negative voltages) are well known to those skilled in the art in light of this disclosure. Accordingly, for sake of brevity, these discussions will not be repeated.

Figure 4:
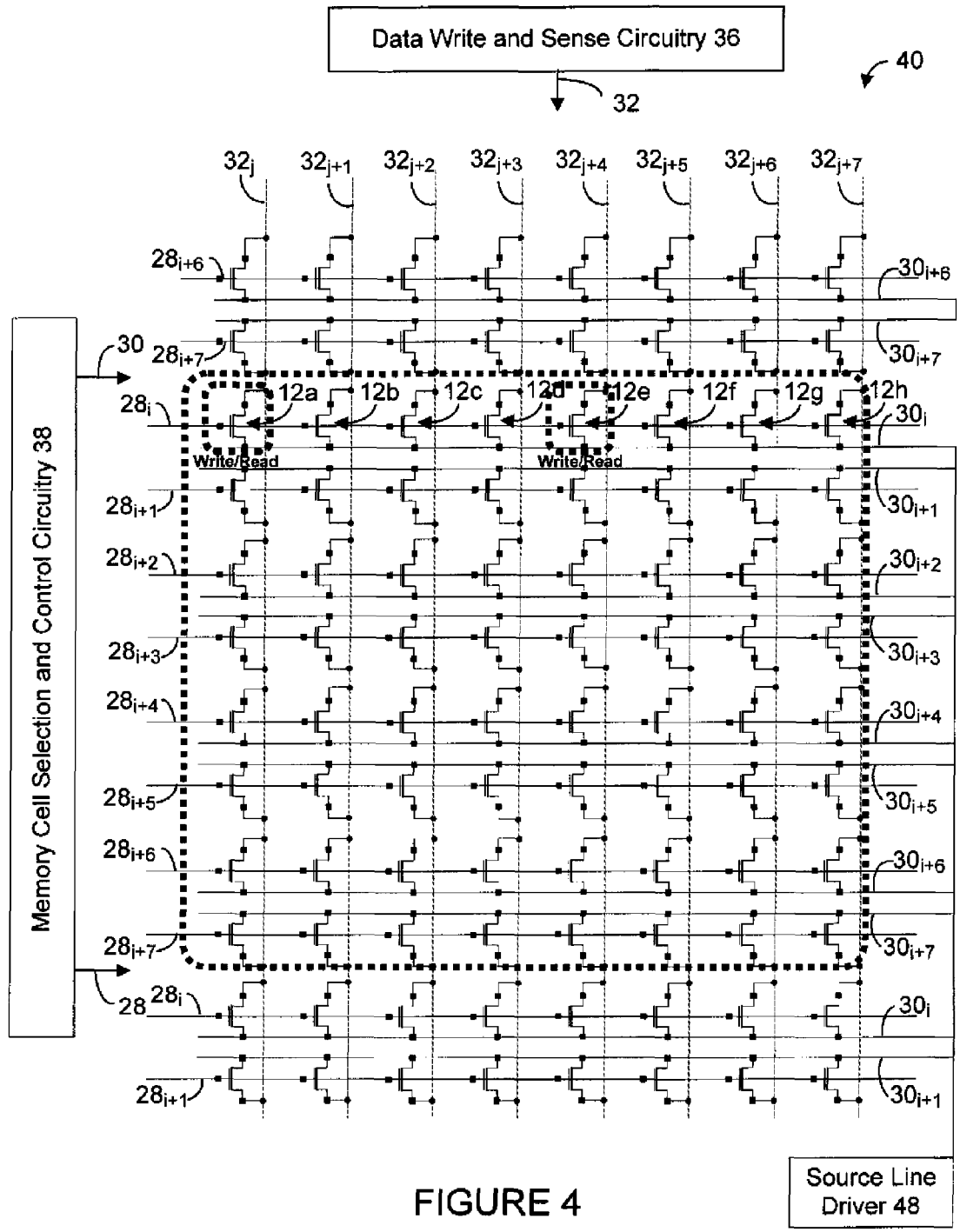
FIG. 4 shows an exemplary embodiment of a memory array having a plurality of memory cells and employing a separate source line configuration for each row of memory cells in accordance with an embodiment of the present disclosure.

Referring to FIG. 4, there is shown an exemplary embodiment of a memory array 40 having a plurality of memory cells 12 and a separate source line configuration for each row of memory cells 12 in accordance with an embodiment of the present disclosure. The plurality of memory cells 12 include a sub-array of memory cells 12 (for example, 8×8 sub-array of memory cells 12 enclosed by the dotted line). The semiconductor DRAM device 10 may include data write and sense circuitry 36 coupled to a plurality of bit lines 32 (BL) of the plurality of memory cells 12 (for example, $32_j$, $32_{j+1}$, $32_{j+2}$, $32_{j+3}$, $32_{j+4}$, $32_{j+5}$, $32_{j+6}$, and $32_{j+7}$). Also, the semiconductor DRAM device 10 may include memory cell selection and control circuitry 38 coupled to a plurality of word lines 28 (WL) (for example, $28_i$, $28_{i+1}$, $28_{i+2}$, $28_{i+3}$, $28_{i+4}$, $28_{i+5}$, $28_{i+6}$, and $28_{i+7}$) and/or a plurality of source lines 30 (SL) (for example, $30_i$, $30_{i+1}$, $30_{i+2}$, $30_{i+3}$, $30_{i+4}$, $30_{i+5}$, $30_{i+6}$, and $30_{i+7}$). In an exemplary embodiment, the source lines 30 (SL) (for example, $30_i$, $30_{i+1}$, $30_{i+2}$, $30_{i+3}$, $30_{i+4}$, $30_{i+5}$, $30_{i+6}$, and $30_{i+7}$) of the sub-array of memory cells 12 may be coupled together and driven by a source line driver 48 (e.g., inverter circuits and/or logic circuits). Although the source line driver 48 shown in FIG. 4, may be an independent voltage driver, the source line driver 48 may be located within and/or integrated with the memory cell selection and control circuitry 38. Therefore, an amount of space taken by source line drivers 48 in the semiconductor DRAM device 10 may be reduced by coupling a plurality of source lines (SL) 30 of a sub-array of memory cells 12 to a single source line driver 48.

As illustrated in FIG. 4, a sub-array of memory cells 12 of the semiconductor DRAM device 10 may include eight rows by eight columns of memory cells 12 having a plurality of source lines (SL) coupled to a single source line (SL) driver. It may be appreciated by one skilled in the art that the size of the sub-array of memory cells 12 having a plurality of source lines (SL) coupled to a single source line (SL) driver may vary, for example symmetrical sub-array, but not limited to, four rows by four columns, sixteen rows by sixteen columns, thirty-two rows by thirty-two columns, sixty-four rows by sixty-four columns, etc. Also, the sub-array of memory cells 12 may be asymmetrical sub-array, for example, but not limited to, four rows by third-two columns, eight rows by four columns, sixteen rows by thirty-two columns, etc.

In an exemplary embodiment, several factors may determine the size of a sub-array of memory cells 12 of the semiconductor DRAM device 10 including a plurality of source lines (SL) coupled to a single source line (SL) driver. A power consumption of the semiconductor DRAM device 10 may determine a size of a sub-array of memory cells 12 including a plurality of source lines (SL) coupled to a single source line (SL) driver. For example, a sixteen rows by sixteen columns sub-array of memory cells 12 may consume more power compared to a four rows by four columns sub-array of memory cells 12 because a greater number of source lines (SL) are coupled together. The source line (SL) driver may consume more power (for example, applying higher voltage) by driving a greater number of source lines (SL) coupled together between a high voltage and a low voltage to perform various operations (for example, read, write, refresh, and/or inhibit). Also by coupling a greater number of source lines (SL) together, the source line (SL) driver may apply a higher voltage to drive the greater number of source lines (SL) and may consume more power because a thicker gauged wire and/or metal plate may be necessary in order to withstand the high voltage applied by the source line (SL) driver.

Also, disturbance (e.g., influence a data state stored on a memory cell 12) on one or more unselected source lines (SL) may determine a size of a sub-array of memory cells 12 including a plurality of source line (SL) coupled to a single source line (SL) driver. For example, the source line (SL) driver may apply a voltage to a plurality of coupled source lines (SL) to perform a read and/or a write operations. Although, a single row may be selected for a read and/or a write operations, all coupled source lines (SL) may receive a voltage applied by the source line (SL) driver. Therefore, one or more memory cells 12 coupled to the unselected source lines (SL) may be disturbed (e.g., influence an amount of charged stored in the memory cells 12) by a voltage applied by the source line (SL) driver.

In addition, an amount of area on a circuit board or die available for source line (SL) drivers may determine a size of a sub-array of memory cells 12 including a plurality of source line (SL) coupled to the source line (SL) drivers. For example, a small amount of area on a circuit board or die may be available to accommodate source line (SL) drivers. Thus, a small number of source line (SL) drivers may be placed on the circuit board or die and a number of source lines (SL) coupled to the source line (SL) drivers may increase. Also, a large amount of area on a circuit board or die may be available to accommodate source line (SL) drivers. Thus, a large number of source line (SL) drivers may be placed on the circuit board or die and a number of source lines (SL) coupled to the source line (SL) drivers may decrease.

In an exemplary embodiment, memory cells 12 may be written using a two step operation wherein a given row of memory cells 12 are written to a first predetermined data state by first executing a "clear" operation (which, in this exemplary embodiment, a selected row $28_i$ and/or all of the memory cells 12 of the given row are written or programmed to logic low (binary "0" 1 date state)) and thereafter selected memory cells 12 may be written to a second predetermined data state (i.e., a selective write operation to the second predetermined data state). The "clear" operation may be performed by writing each memory cell 12 of the given row to a first predetermined data state (in this exemplary embodiment the first predetermined data state is logic low (binary "0" data state) using the inventive technique described above.

In particular, memory transistor 14 of each memory cell 12 of a given row (for example, memory cells 12a-12h) is controlled to store a majority charge carrier concentration in the electrically floating body region 18 of the transistor 14 which corresponds to a logic low (binary "0" data state). For example, control signals to implement a "clear" operation may be applied to the gate 16, the source region 20, and the drain region 22 of the memory transistor 14 of memory cells 12a-12h. In an exemplary embodiment, a "clear operation" includes applying (i) 1.5V to the gate 16, (ii) 0V to the source region 20, and (iii) 0V to the drain region 22 of the memory transistor 14. In response, the same logic state (for example, logic low (binary "0" data state)) may be stored in memory cells 12a-12h and the state of memory cells 12a-12h may be "cleared". For example, it may be preferable to maintain the gate-to-source voltage below the threshold voltage of the transistor of memory cell 12 to further minimize or reduce power consumption.

Thereafter, selected memory cells 12 of a given row may be written to the second predetermined logic state. For example, the memory transistors 14 of certain memory cells 12 of a given row may be written to the second predetermined logic state in order to store the second predetermined logic state in memory cells 12. For example, memory cells 12a and 12e may be written to logic high (binary "1" data state) (as shown in the selected row $28_i$), via an impact ionization effect and/or avalanche multiplication, by applying (i) −2.0V to the gate (via word line $28_i$), (ii) −2.0V to the source region (via source line $30_i$), and (iii) 1.5V to the drain region (via bit line $32_j$ and $32_{j+4}$). Particularly, such control signals may generate or provide a bipolar current in the electrically floating body region 18 of the memory transistor 14 of memory cells 12a and 12e. The bipolar current may cause or produce impact ionization and/or the avalanche multiplication phenomenon in the electrically floating body region 18 of the memory transistors 14 of memory cells 12a and 12e. In this way, an excess of majority charge carriers may be provided and stored in the electrically floating body region 18 of the memory transistor 14 of memory cells 12a and 12e which corresponds to logic high (binary "1" data state).

In an exemplary embodiment, memory cells 12b, 12c, 12d, 12f, 12g, and 12h (as shown in the selected row $28_i$) may be maintained at logic low (binary "0" data state) by applying a voltage to inhibit impact ionization to the drain region 22 of each memory cell 12b, 12c, 12d, 12f, 12g, and 12h. For example, applying 1V to the drain regions 22 of memory cells 12b, 12c, 12d, 12f, 12g, and 12h (via bit lines $32_{j+1}$, $32_{j+2}$, $32_{j+3}$, $32_{j+5}$, $32_{j+6}$, and $32_{j+7}$) may inhibit impact ionization in memory cells 12b, 12c, 12d, 12f, 12g, and 12h during the selective write operation for memory cells 12a, and 12e.

Also, memory cells 12 (as shown in the selected row $28_i$) may be selectively written to logic high (binary "1" data state) using the band-to-band tunneling (GIDL) method. As mentioned above, the band-to-band tunneling provides, produces and/or generates an excess of majority charge carriers in the electrically floating body 18 of the memory transistors 14 of each selected memory cell 12 (in this exemplary embodiment, memory cells 12a and 12e). For example, after implementing the "clear" operation, memory cells 12a and 12e may be written to logic high (binary "1" data state), via band-to-band tunneling, by applying (i) −3V to the gate 16 (via word line $28_i$), (ii) −0.5V to the source region 20 (via source line $30_i$), and (iii) 1.0V to the drain region 22 (via bit line $32_j$ and $32_{j+4}$).

A selected row of memory cells 12 may be read by applying read control signals to the associated word line (WL) 28 and associated source lines (SL) 30 and sensing a signal (voltage and/or current) on associated bit lines (EL) 32. In an exemplary embodiment, memory cells 12a-12h (e.g., as shown in the selected row $28_i$) may be read by applying (i) −0.5V to the gate 16 (via word line $28_i$), (ii) 2.5V to the source region 20 (via source lines 30 coupled to a single source line driver) and (iii) 0V to the drain region 22 (via bit lines 32). The data write and sense circuitry 36 may read the data state of the memory cells 12a-12h by sensing the response to the read control signals applied to word line $28_i$, source line 30 and bit line 32. In response to the read control signals, memory cells 12a-12h may generate a bipolar transistor current which may be representative of the data state of memory cells 12a-12h. For example, memory cells 12a and 12e (which were earlier written to logic high (binary "1" data state)), in response to the read control signals, may generate a bipolar transistor current which is considerably larger than any channel current. In contrast, memory cells 12b, 12c, 12d, 12f, 12g, and 12h (which were earlier programmed to logic low (binary "0" data state)), such control signals induce, cause and/or produce little to no bipolar transistor current (for example, a considerable, substantial or sufficiently measurable bipolar transistor current). The circuitry in data write and sense circuitry 36 to sense the data state (for example, a cross-coupled sense amplifier) senses the data state using primarily and/or based substantially on the bipolar transistor current.

Thus, in response to read control signals, the memory transistor 14 of each memory cell 12a-12h may generate a bipolar transistor current which is representative of the data state stored therein. The data sensing circuitry in data write and sense circuitry 36 may determine the data state of memory cells 12a-12h based substantially on the bipolar transistor current induced, caused and/or produced in response to the read control signals.

Figure 5:
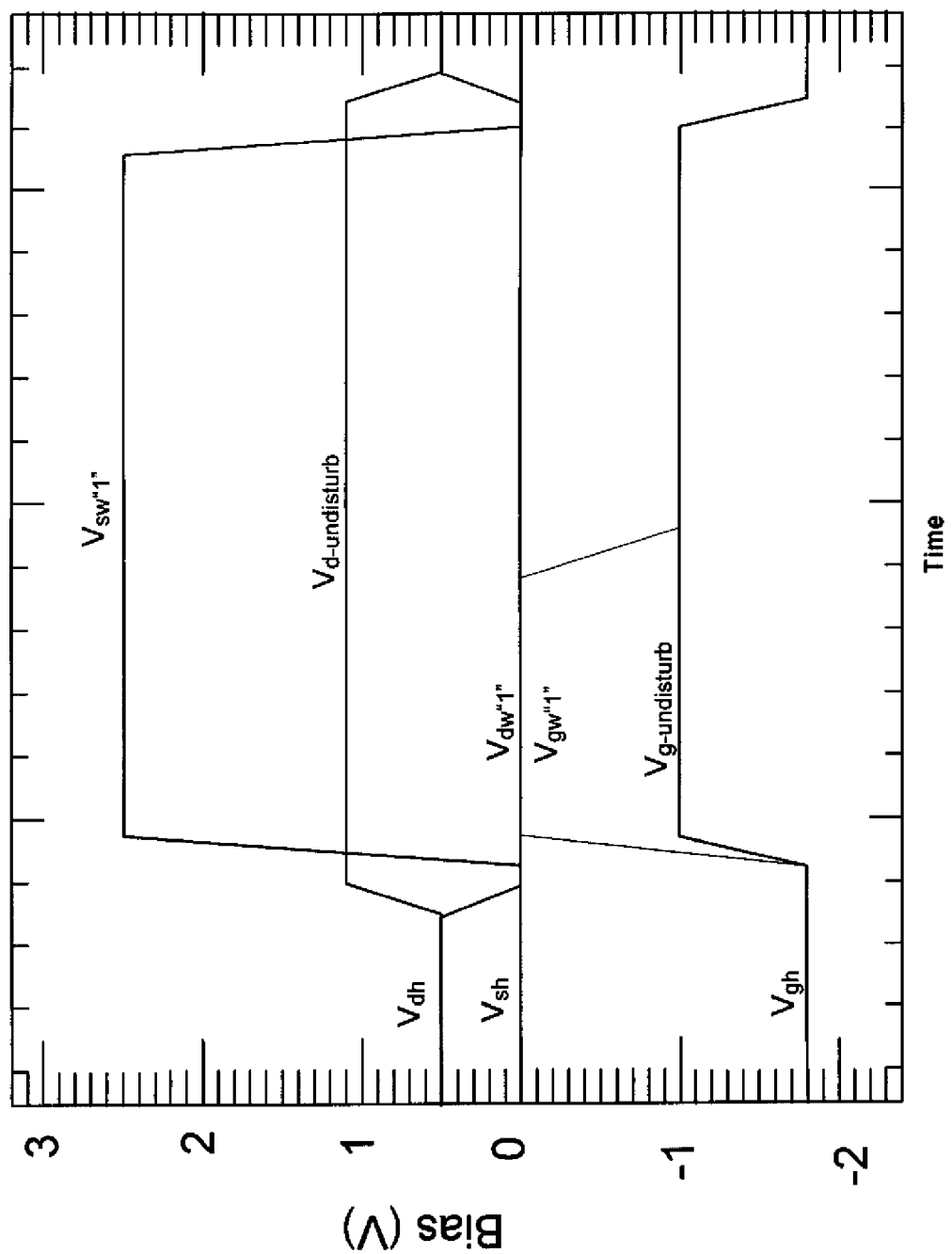
FIG. 5 shows a diagram of voltage control signals to implement a write operation for logic high or binary "1" data state into a memory cell in accordance with an embodiment of the present disclosure.

FIG. 5 shows a diagram of voltage control signals to implement a write operation for logic high (binary "1" data state) into a memory cell in accordance with an exemplary embodiment of the present disclosure. The control signals may be configured to reduce a number of source line (SL) drivers by coupling a plurality of source lines (SL) to a single source line (SL) driver as well as a one step write whereby selected memory cells 12 of a selected row of memory cells 12 may be selectively written or programmed to either logic high (binary "1" data state) or logic low (binary "0" date state) without first implementing a "clear" operation. For example, the temporally varying control signals to implement the write logic high (binary "1" data state) operation include the voltage applied to the gate 16 ($V_{gw"1"}$), the voltage applied to the source region 20 ($V_{sw"1"}$), and the voltage applied to the drain region 22 ($V_{dw"1"}$). The binary "1" or "0" data states may be written to one or more selected memory cells 12 by applying appropriate word line (WL) voltages and/or bit line (BL) voltages. For example, a source voltage ($V_{sw"1"}$) of approximately 2.5V may be applied to the source region 20 (via, for example, the associated coupled source lines $30_i$, $30_{i+1}$, $30_{i+2}$, $30_{i+3}$, $30_{i+4}$, $30_{i+5}$, $30_{i+6}$, and $30_{i+7}$) and a drain voltage ($V_{dw"1"}$) of approximately 0V may be applied to the drain region 22 (via, for example, the associated selected bit line $32_j$ and $32_{j+4}$) of the memory transistor 14 of the memory cell 12 before a gate voltage ($V_{gw"1"}$) of approximately 0V may be applied to the gate 16 (via, for example, the associated selected word line $28_i$), simultaneously thereto, or after the gate voltage ($V_{gw"1"}$) is applied to gate 16. It is preferred that the drain voltage ($V_{dw"1"}$) include an amplitude which may be sufficient to maintain a bipolar current that is suitable for programming the memory cell 12 to logic high (binary "1" data state). From a relative timing perspective, it is preferred that the drain voltage ($V_{dw"1"}$) may extend beyond/after or continue beyond the conclusion of the gate voltage ($V_{gw"1"}$), or extend beyond/after or continue beyond the time the gate voltage ($V_{gw"1"}$) is reduced. Therefore, majority charge carriers may be generated in the electrically floating body region 18 via a bipolar current and majority charge carriers may accumulate (and be stored) in a portion of the electrically floating body region 18 of the memory transistor 14 of the memory cell 12 that may be juxtaposed or near the gate dielectric (which is disposed between the gate 16 and the electrically floating body region 18).

Also illustrated in FIG. 5, an unselected holding drain voltage ($V_{d\text{-}undisturb}$) of approximately 1.0V may be applied to the drain region 22 (via, for example, the associated unselected bit line $32_{j+1}$, $32_{j+2}$, $32_{j+3}$, $32_{j+5}$, $32_{j+6}$, and $32_{j+7}$) of the memory transistor 14 of the memory cell 12 before an unselected holding gate voltage ($V_{g\text{-}undisturb}$) of approximately −1.0V may be applied to the gate 16 (via, for example, the associated unselected word line $28_{i+1}$, $28_{i+2}$, $28_{i+3}$, $28_{i+4}$, $28_{i+5}$, $28_{i+6}$, and $28_{i+7}$), simultaneously thereto, or after the gate voltage ($V_{g\text{-}undisturb}$) is applied to gate 16.

Figure 6:
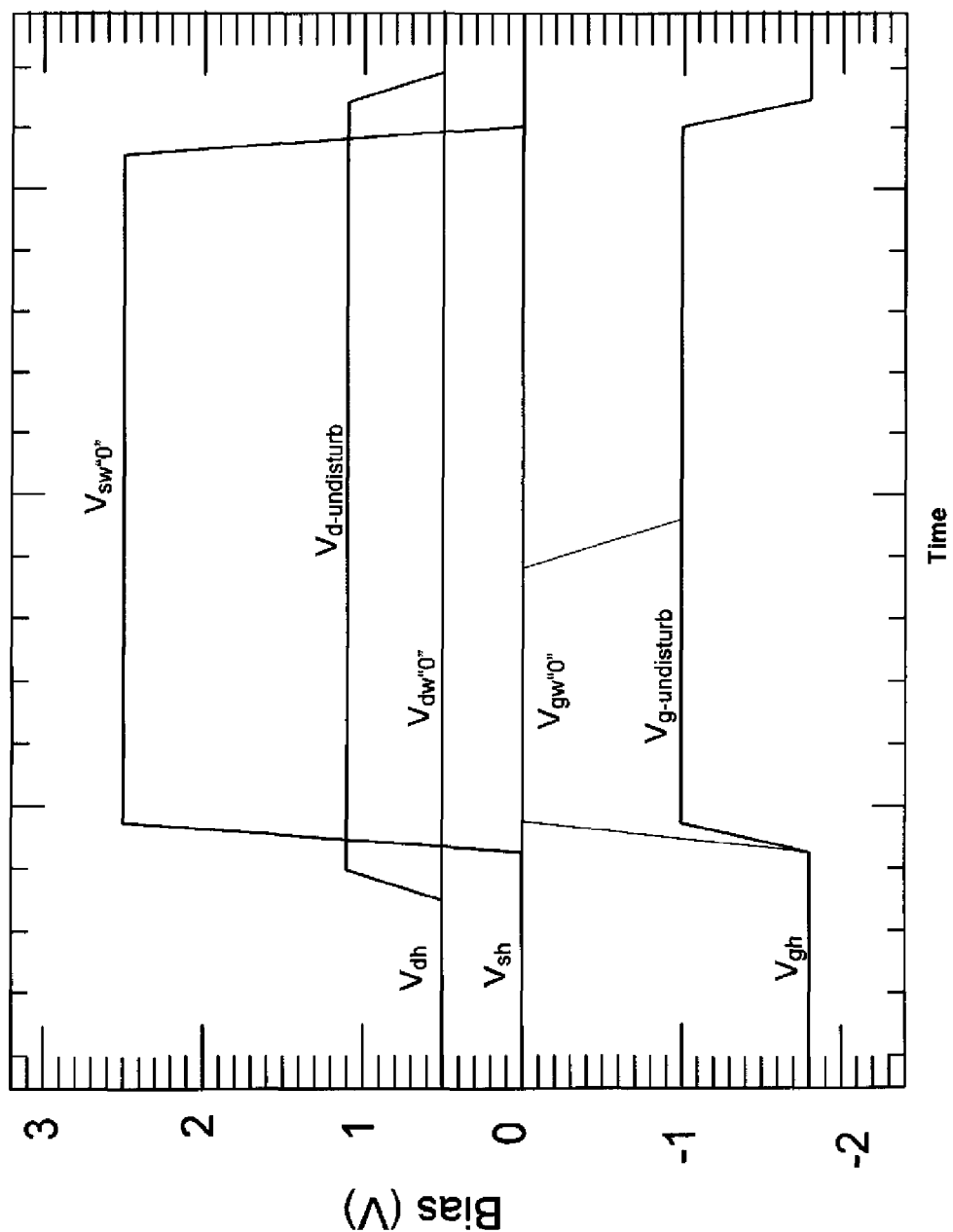
FIG. 6 shows a diagram of voltage control signals to implement a write operation for logic low or binary "0" data state into a memory cell in accordance with an embodiment of the present disclosure.

FIG. 6 shows a diagram of voltage control signals to implement a write operation for logic low (binary "0" data state) into a memory cell in accordance with an embodiment of the present disclosure. The temporally varying control signals that may be implemented to write logic low (binary "0" data state) may include a voltage applied to the gate 16 ($V_{gw"0"}$), a voltage applied to the source 20 ($V_{sw"0"}$), and a voltage applied to the drain region 22 ($V_{dw"0"}$). For example, a source voltage ($V_{sw"0"}$) of approximately 2.5V may be applied to the source region 20 (via, for example, the coupled source lines $30_i$, $30_{i+1}$, $30_{i+2}$, $3_{i+3}$, $30_{i+4}$, $30_{i+5}$, $30_{i+6}$, and $30_{i+7}$) and a drain voltage of approximately 0.5V may be applied to the drain region 22 ($V_{dw"0"}$), may be applied before a gate voltage ($V_{gw"0"}$) of approximately 0V is applied to the gate 16, or simultaneously thereto, or after the gate voltage ($V_{gw"0"}$) is applied to the gate 16. Particularly, the source to drain voltage ($V_{sw"0"}$-$V_{dw"0"}$) may include an amplitude which may be insufficient to maintain a bipolar current that is suitable for writing the memory cell 12 to logic high (binary "1" data state). From a relative timing perspective, it may be preferred that the drain voltage ($V_{dw"0"}$) may extend beyond/after or continue beyond the conclusion of the gate voltage ($V_{gw"0"}$), or extend beyond/after or continue beyond the time the gate voltage ($V_{gw"0"}$) is reduced. For example, majority charge carriers may be generated in the electrically floating body region 18 via a bipolar current and majority charge carriers may be accumulated (and be stored) in a portion of the electrically floating body region 18 of the memory transistor 14 of the memory cell 12 that is juxtaposed or near the gate dielectric (which is disposed between the gate 16 and the electrically floating body region 18).

Also illustrated in FIG. 6, an unselected masking drain voltage ($V_{d\text{-}undisturb}$) of approximately 1.0V may be applied to the drain region 22 (via, for example, the associated unselected bit line $32_{j+1}$, $32_{j+2}$, $32_{j+3}$, $32_{j+5}$, $32_{j+6}$, and $32_{j+7}$) of the memory transistor 14 of the memory cell 12 before an unselected disturb reduction gate voltage ($V_{g\text{-}undisturb}$) of approximately −1.0V may be applied to the gate 16 (via, for example, the associated unselected word line $28_{i+1}$, $28_{i+2}$, $28_{i+3}$, $28_{i+4}$, $28_{i+5}$, $28_{i+6}$, and $28_{i+7}$,), simultaneously thereto, or after the gate voltage ($V_{g\text{-}undisturb}$) is applied to gate 16.

Figure 7:
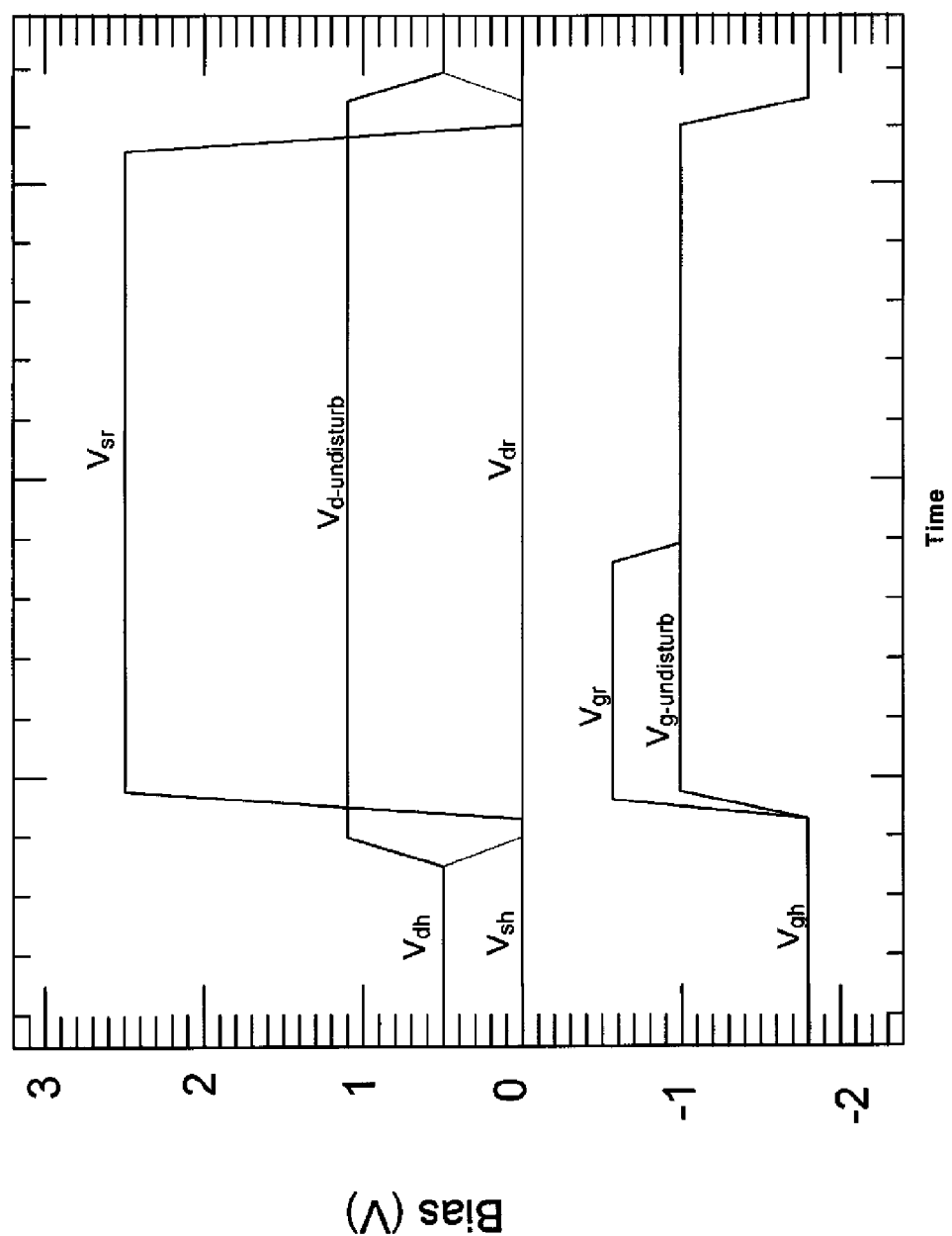
FIG. 7 shows a diagram of voltage control signals to implement a read operation of a memory cell in accordance with an embodiment of the present disclosure.

FIG. 7 shows a diagram of voltage control signals to implement a read operation of a memory cell in accordance with an embodiment of the present disclosure. For example, read control signals may be applied to the source region 20, the drain region 22 and the gate 16. A source voltage ($V_{sr}$) of S approximately 2.5V and a drain voltage ($V_{dr}$) of approximately 0V may be applied to the source region 20 and the drain region 22, respectively, before application of a gate voltage ($V_{gr}$) of approximately −0.5V applied to the gate 16, simultaneously thereto, or after the gate voltage ($V_{gr}$) is applied to the gate 16. Further, the drain voltage ($V_{dr}$) may extend beyond/after or continue beyond the conclusion of the gate voltage ($V_{gr}$), simultaneously thereto (as illustrated in FIG. 7), or before the gate voltage ($V_{gr}$) may conclude or cease.

Also illustrated in FIG. 7, an unselected masking drain voltage ($V_{d\text{-}undisturb}$) of approximately 1.0V may be applied to the drain region 22 (via, for example, the associated unselected bit line $32_{j+1}$, $32_{j+2}$, $32_{j+3}$, $32_{j+5}$, $32_{j+6}$, and $32_{j+7}$) of the memory transistor 14 of the memory cell 12 before an unselected disturb reduction gate voltage ($V_{g\text{-}undisturb}$) of approximately −1.0V may be applied to the gate 16 (via, for example, the associated unselected word line $28_{i+1}$, $28_{i+2}$, $28_{i+3}$, $28_{i+4}$, $28_{i+5}$, $28_{i+6}$, and $28_{i+7}$), simultaneously thereto, or after the gate voltage ($V_{g\text{-}undisturb}$) is applied to gate 16.

In an exemplary embodiment, during the read operation, a bipolar current is generated in memory cells 12 storing logic high (binary "1" data state) and little to no bipolar current is generated in memory cells 12 storing logic low (binary "0" data state). The data state may be determined primarily by, sensed substantially using and/or based substantially on the bipolar transistor current that is responsive to the read control signals and significantly less by the interface channel current component, which is less significant and/or negligible relatively to the bipolar component.

The writing and reading techniques described herein may be employed in conjunction with a plurality of memory cells 12 arranged in an array of memory cells. A memory array implementing the structure and techniques of the present disclosures may be controlled and configured including a plurality of memory cells 12 having a common source line (SL) for each row of memory cells 12. The exemplary layouts or configurations (including exemplary control signal voltage values), in accordance to one or more exemplary embodiments of the present disclosure are shown, each consisting of the control signal waveforms and exemplary array voltages during one-step writing and reading.

Accordingly, the illustrated/exemplary voltage levels to implement the write and read operations are merely exemplary. The indicated voltage levels may be relative or absolute. Alternatively, the voltages indicated may be relative in that each voltage level, for example, may be increased or decreased by a given voltage amount (e.g., each voltage may be increased or decreased by 0.5V, 1.0V and 2.0V) whether one or more of the voltages (e.g., the source region voltage, the drain region voltage or gate voltage) become or are positive and negative.

Figure 8:
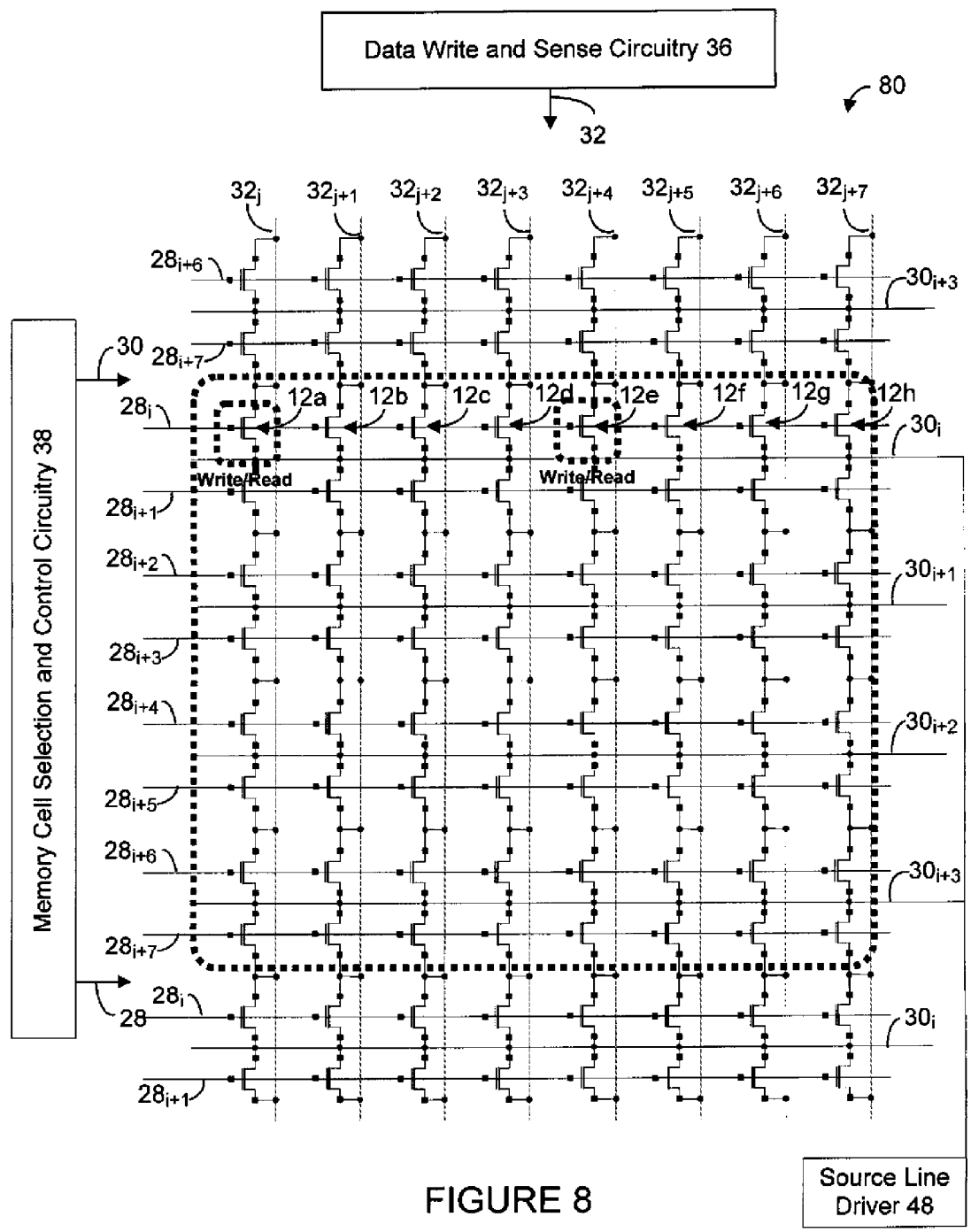
FIG. 8 shows a schematic of a memory array implementing the structure and techniques having a common source line in accordance with an embodiment of the present disclosure.

Referring to FIG. 8, there is shown a schematic of a memory array 80 implementing the structure and techniques having a common source line 30 (SL) in accordance with an exemplary embodiment of the present disclosure. As mentioned above, the present disclosure may be implemented in any memory array architecture having a plurality of memory cells 12 that employ memory transistors 14. For example, as illustrated in FIG. 8, a memory array implementing the structure and techniques of the present disclosure may be controlled and configured having a common source line (SL) for every two rows of memory cells 12 (a row of memory cells 12 includes a common word line (WL)). The plurality of memory cells 12 include a sub-array of memory cells 12 (for example, 8×8 sub-array of memory cells 12 enclosed by the dotted line). The semiconductor DRAM device 10 may include data write and sense circuitry 36 coupled to a plurality of bit lines (BL) 32 of the plurality of memory cells 12 (for example, $32_j$, $32_{j+1}$, $32_{j+2}$, $32_{j+3}$, $32_{j+4}$, $32_{j+5}$, $32_{j+6}$, and $32_{j+7}$). Also, the semiconductor DRAM device 10 may include memory cell selection and control circuitry 38 coupled to one or more word lines (WL) 28 (for example, $28_i$, $28_{i+1}$, $28_{i+2}$, $28_{i+3}$, $28_{i+4}$, $28_{i+5}$, $28_{i+6}$, and $28_{i+7}$) and/or common source lines (SL) 30 (for example, $30_i$, $30_{i+1}$, $30_{i+2}$, and $30_{i+3}$). In an exemplary embodiment, the source lines 30 (SL) (for example, $30_i$, $30_{i+1}$, $30_{i+2}$, $30_{i+3}$, $30_{i+4}$, $30_{i+5}$, $30_{i+6}$, and $30_{i+7}$) of the sub-array of memory cells 12 may be coupled together and driven by a source line driver 48 (e.g., inverter circuits and/or logic circuits). Although the source line driver 48 shown in FIG. 4, may be an independent voltage driver, the source line driver 48 may be located within and/or integrated with the memory cell selection and control circuitry 38. An amount of space taken by source line drivers 48 in the semiconductor DRAM device 10 may be reduced by coupling a plurality of common source lines (SL) 30 of a sub-array of memory cells 12 to a single source line driver 48.

As illustrated in FIG. 8, a sub-array of memory cells 12 of the semiconductor DRAM device 10 may include eight rows by eight columns of memory cells 12 having a plurality of common source lines (SL) coupled to a single source line (SL) driver. It may be appreciated by one skilled in the art that the sub-array of memory cells 12 having a plurality of common source lines 30 (SL) coupled to a single source line (SL) driver may be any size, for example, but not limited to, four rows by four columns, sixteen rows by sixteen columns, thirty-two rows by thirty-two columns, sixty-four rows by sixty-four columns, etc.

An example (including exemplary control signal voltage values), according to certain aspects of the present disclosure may be also shown that consists of the control signal waveforms and exemplary array voltages during writing operation and/or reading operation. For example, the temporally varying control signals to implement the write operation may include (i) a voltage ($V_{sw}$) applied to the source 20 via the associated common coupled source lines (SL), (ii) a voltage ($V_{gw}$) applied to the gate 16 via the associated word line (WL), and (iii) a voltage ($V_{dw}$) applied to the drain region 22 via the associated bit line (BL). The binary "1" or "0" data states may be written to one or more selected memory cells 12 by applying appropriate word line (WL) voltages and/or bit line (BL) voltages.

Figure 9:
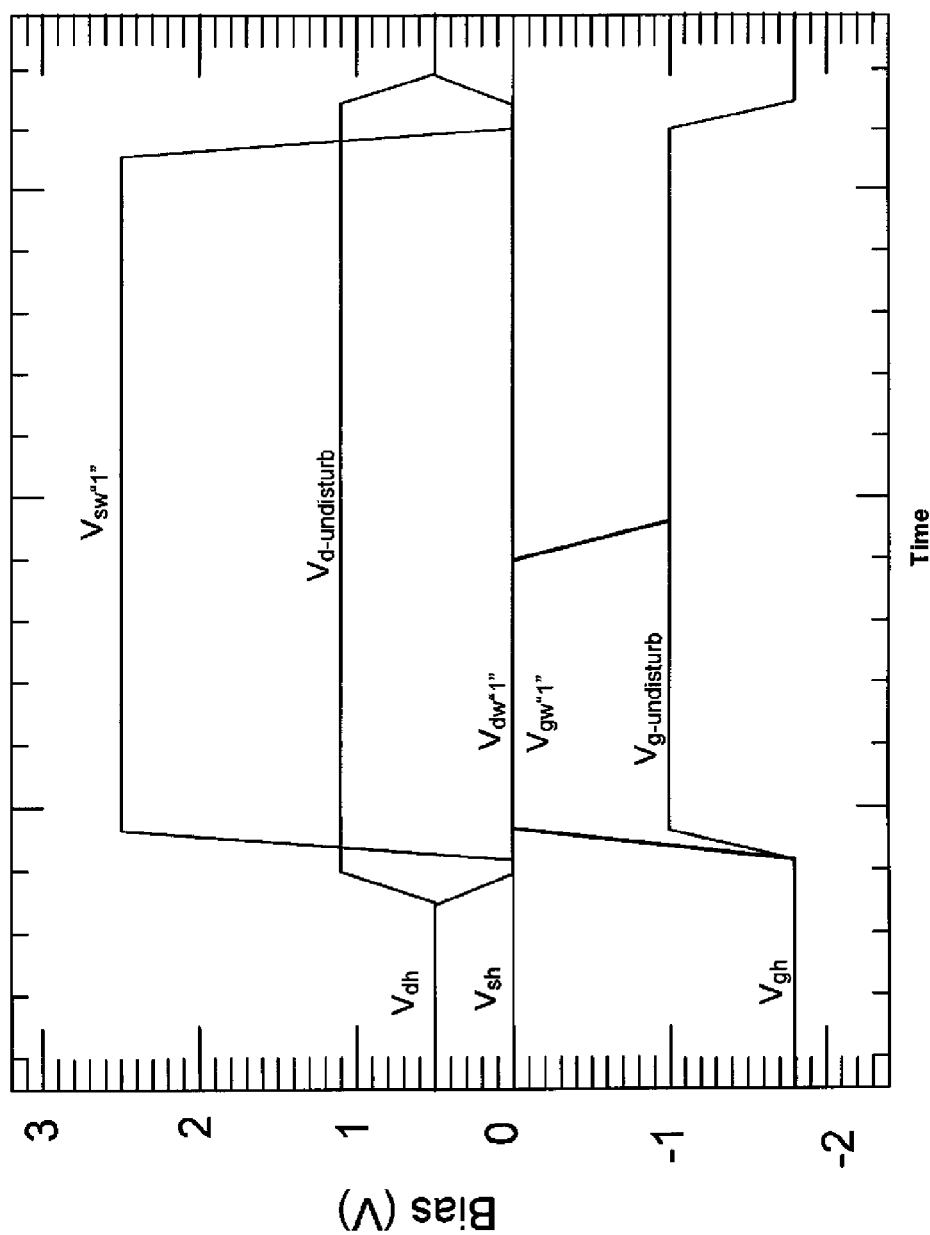
FIG. 9 shows a diagram of voltage control signals to implement a write operation for logic high or binary "1" data state into a memory cell in accordance with an embodiment of the present disclosure.

FIG. 9 shows a diagram of voltage control signals to implement a write operation for logic high (binary "1" data state) into a memory cell in accordance with an exemplary embodiment of the present disclosure. The control signals may be configured to reduce a number of source line (SL) drivers by coupling a plurality of common source lines (SL) to a single source line (SL) driver as well as a write operation whereby selected memory cells 12 of a selected row of memory cells 12 may be selectively written or programmed to either logic high (binary "1" data state) or logic low (binary "0" date state) without first implementing a "clear" operation. For example, the temporally varying control signals to implement the write logic high (binary "1" data state) operation include the voltage applied to the gate 16 ($V_{gw"1"}$), the voltage applied to the source region 20 ($V_{sw"1"}$), and the voltage applied to the drain region 22 ($V_{dw"1"}$). The binary "1" data state may be written to one or more selected memory cells 12 by applying appropriate word line (WL) voltages and/or bit line (EL) voltages. For example, a source voltage ($V_{sw"1"}$) of approximately 2.5V may be applied to the source region 20 (via, for example, the associated coupled common source lines $30_i$, $30_{i+1}$, $30_{i+2}$, and $30_{i+3}$) and a drain voltage ($V_{dw"1"}$) of approximately 0V may be applied to the drain region 22 (via, for example, the associated selected bit line $32_j$ and $32_{j+4}$) of the memory transistor 14 of the memory cell 12 before a gate voltage ($V_{gw"1"}$) of approximately 0V may be applied to the gate 16 (via, for example, the associated selected word line $28_i$), simultaneously thereto, or after the gate voltage ($V_{gw"1"}$) is applied to gate 16. It is preferred that the drain voltage ($V_{dw"1"}$) include an amplitude which may be sufficient to maintain a bipolar current that is suitable for programming the memory cell 12 to logic high (binary "1" data state). From a relative timing perspective, it is preferred that the drain voltage ($V_{dw"1"}$) may extend beyond/after or continue beyond the conclusion of the gate voltage ($V_{gw"1"}$), or extend beyond/after or continue beyond the time the gate voltage ($V_{gw"1"}$) is reduced. Therefore, majority charge carriers may be generated in the electrically floating body region 18 via a bipolar current and majority charge carriers may accumulate (and be stored) in a portion of the electrically floating body region 18 of the memory transistor 14 of the memory cell 12 that may be juxtaposed or near the gate dielectric (which is disposed between the gate 16 and the electrically floating body region 18).

Also illustrated in FIG. 9, an unselected masking drain voltage ($V_{d-undisturb}$) of approximately 1.0V may be applied to the drain region 22 (via, for example, the associated unselected bit line $32_{j+1}$, $32_{j+2}$, $32_{j+3}$, $32_{j+5}$, $32_{j+6}$, and $32_{j+7}$) of the memory transistor 14 of the memory cell 12 before an unselected disturb reduction gate voltage ($V_{g-undisturb}$) of approximately −1.0V may be applied to the gate 16 (via, for example, the associated unselected word line $28_{i+1}$, $28_{i+2}$, $28_{i+3}$, $28_{i+4}$, $28_{i+5}$, $28_{i+6}$, and $28_{i+7}$), simultaneously thereto, or after the gate voltage ($V_{g-undisturb}$) is applied to gate 16.

Figure 10:
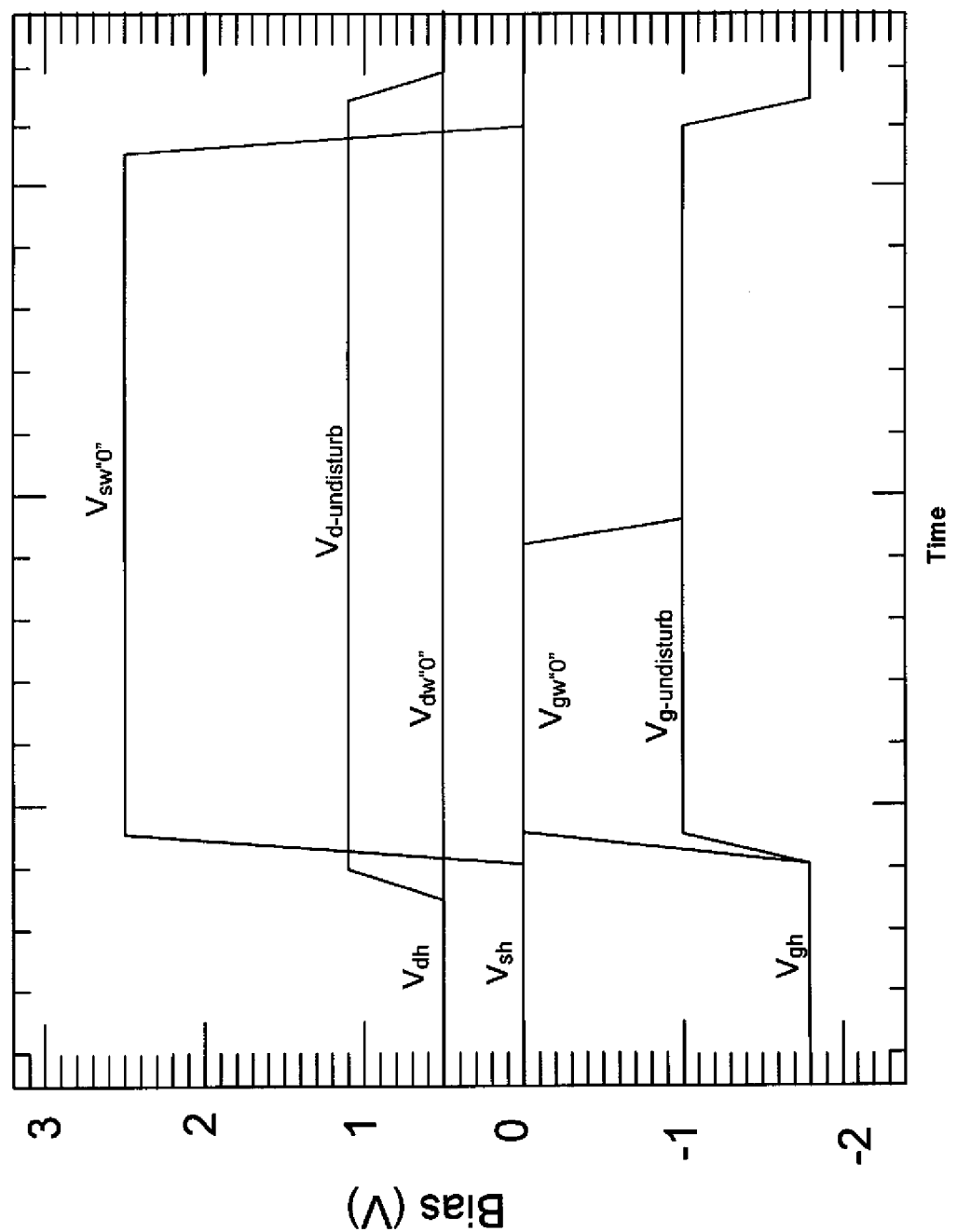
FIG. 10 shows a diagram of voltage control signals to implement a write operation for logic low or binary "0" data state into a memory cell in accordance with an embodiment of the present disclosure.

FIG. 10 shows a diagram of voltage control signals to implement a write operation for logic low (binary "0" data state) into a memory cell in accordance with an embodiment of the present disclosure. The temporally varying control signals that may be implemented to write logic low (binary "0" data state) may include a voltage applied to the gate 16 ($V_{gw"0"}$) a voltage applied to the source 20 ($V_{gw"0"}$), and a voltage applied to the drain region 22 ($V_{dw"0"}$). For example, a source voltage ($V_{sw"0"}$) of approximately 2.5V may be applied to the source region 20 (via, for example, the associated coupled common source lines $30_i$, $30_{i+1}$, $30_{i+2}$, and $30_{i+3}$) and a drain voltage of approximately 0.5V may be applied to the drain region 22 ($V_{dw"0"}$), may be applied before a gate voltage ($V_{gw"0"}$) of approximately 0V is applied to the gate 16, or simultaneously thereto, or after the gate voltage ($V_{gw"0"}$) is applied to the gate 16. Particularly, the source to drain voltage ($V_{sw"0"} - V_{dw"0"}$) may include an amplitude which may be insufficient to maintain a bipolar current that is suitable for writing the memory cell 12 to logic high (binary "1" data state). From a relative timing perspective, it may be preferred that the drain voltage ($V_{dw"0"}$) may extend beyond/after or continue beyond the conclusion of the gate voltage ($V_{gw"0"}$), or extend beyond/after or continue beyond the time the gate voltage ($V_{gw"0"}$) is reduced. For example, majority charge carriers may be generated in the electrically floating body region 18 via a bipolar current and majority charge carriers may be accumulated (and be stored) in a portion of the electrically floating body region 18 of the memory transistor 14 of the memory cell 12 that is juxtaposed or near the gate dielectric (which is disposed between the gate 16 and the electrically floating body region 18).

Also illustrated in FIG. 10, an unselected masking drain voltage ($V_{d-undisturb}$) of approximately 1.0V may be applied to the drain region 22 (via, for example, the associated unselected bit line $32_{j+1}$, $32_{j+2}$, $32_{j+3}$, $32_{j+5}$, $32_{j+6}$, and $32_{j+7}$) of the memory transistor 14 of the memory cell 12 before an unselected disturb reduction gate voltage ($V_{g-undisturb}$) of approximately −1.0V may be applied to the gate 16 (via, for example, the associated unselected word line $28_{i+1}$, $28_{i+2}$, $28_{i+3}$, $28_{i+4}$, $28_{i+5}$, $28_{i+6}$, and $28_{i+7}$), simultaneously thereto, or after the gate voltage ($V_{g-undisturb}$) is applied to gate 16.

Figure 11:
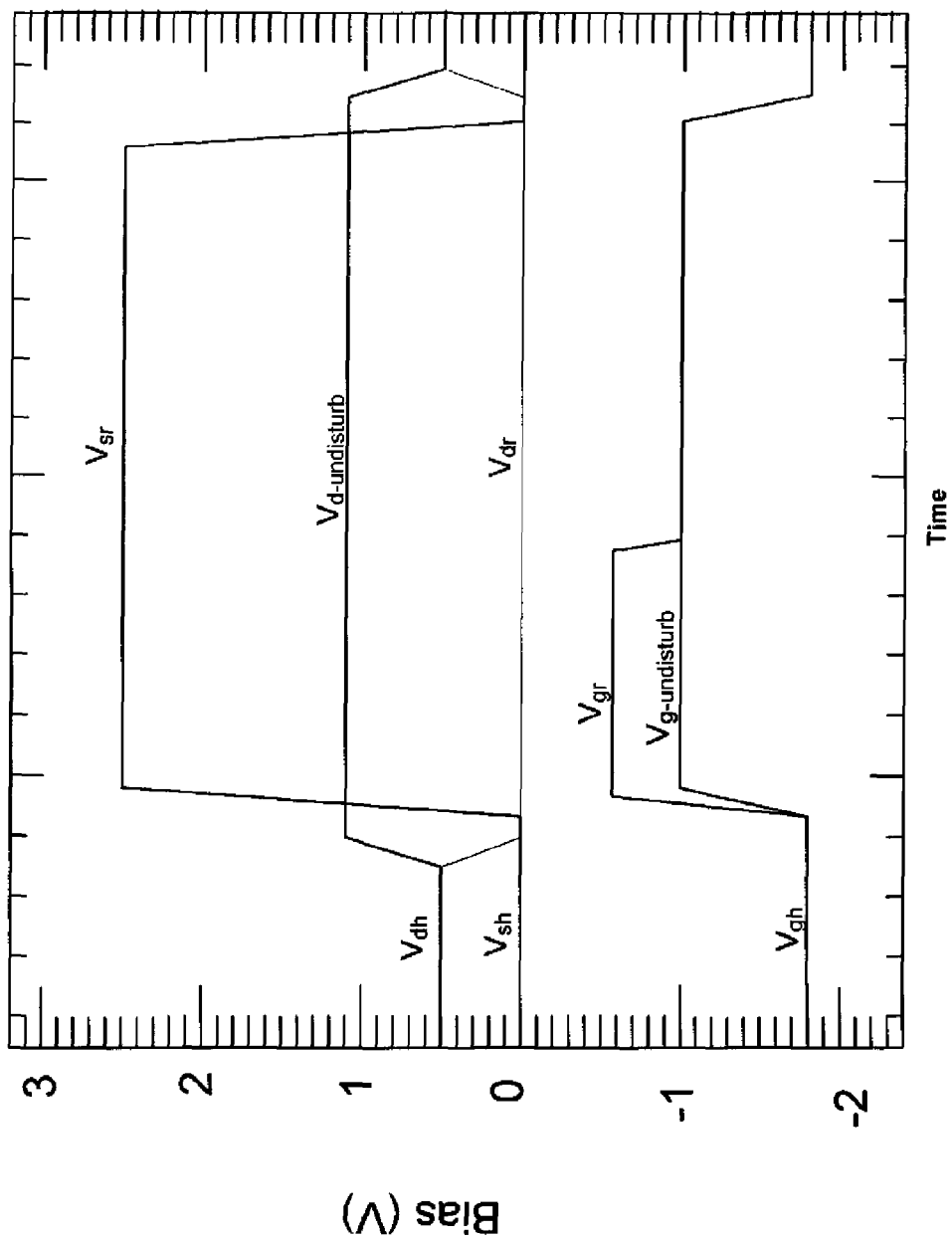
FIG. 11 shows a diagram of voltage control signals to implement a read operation of a memory cell in accordance with an embodiment of the present disclosure.

FIG. 11 shows a diagram of voltage control signals to implement a read operation of a memory cell in accordance with an embodiment of the present disclosure. For example, read control signals may be applied to the source region 20, the drain region 22 and the gate 16. A source voltage ($V_{sr}$) of approximately 2.5V and a drain voltage ($V_{dr}$) of approximately 0V may be applied to the source region 20 and the drain region 22, respectively, before application of a gate voltage ($V_{gr}$) of approximately −0.5V applied to the gate 16, simultaneously thereto, or after the gate voltage ($V_{gr}$) is applied to the gate 16. Further, the drain voltage ($V_{dr}$) may extend beyond/after or continue beyond the conclusion of the gate voltage ($V_{gr}$), simultaneously thereto (as illustrated in FIG. 11), or before the gate voltage ($V_{gr}$) may conclude or cease.

Also illustrated in FIG. 11, an unselected masking drain voltage ($V_{d-undisturb}$) of approximately 1.0V may be applied to the drain region 22 (via, for example, the associated unselected bit line $32_{j+1}$, $32_{j+2}$, $32_{j+3}$, $32_{j+5}$, $32_{j+6}$, and $32_{j+7}$) of the memory is transistor 14 of the memory cell 12 before an unselected disturb reduction gate voltage ($V_{g-undisturb}$) of approximately −1.0V may be applied to the gate 16 (via, for example, the associated unselected word line $28_{i+1}$, $28_{i+2}$, $28_{i+3}$, $28_{i+4}$, $28_{i+5}$, $28_{i+6}$, and $28_{j+7}$), simultaneously thereto, or after the gate voltage ($V_{g-undisturb}$) is applied to gate 16.

In an exemplary embodiment, during the read operation, a bipolar current is generated in memory cells 12 storing logic high (binary "1" data state) and little to no bipolar current is generated in memory cells 12 storing logic low (binary "0" data state). The data state may be determined primarily by, sensed substantially using and/or based substantially on the bipolar transistor current that is responsive to the read control signals and significantly less by the interface channel current component, which is less significant and/or negligible relative to the bipolar component.

The writing and reading techniques described herein may be employed in conjunction with a plurality of memory cells 12 arranged in an array of memory cells. A memory array implementing the structure and techniques of the present disclosures may be controlled and configured including a plurality of memory cells 12 having a common source line (SL) for two rows of memory cells 12. The exemplary layouts or configurations (including exemplary control signal voltage values), in accordance to one or more exemplary embodiments of the present disclosure are shown, each consisting of the control signal waveforms and exemplary array voltages during one-step writing and reading.

Accordingly, the illustrated/exemplary voltage levels to implement the write and read operations are merely exemplary. The indicated voltage levels may be relative or absolute. Alternatively, the voltages indicated may be relative in that each voltage level, for example, may be increased or decreased by a given voltage amount (e.g., each voltage may be increased or decreased by 0.5V, 1.0V and 2.0V) whether one or more of the voltages (e.g., the source region voltage, the drain region voltage or gate voltage) become or are positive and negative.

Figure 12:
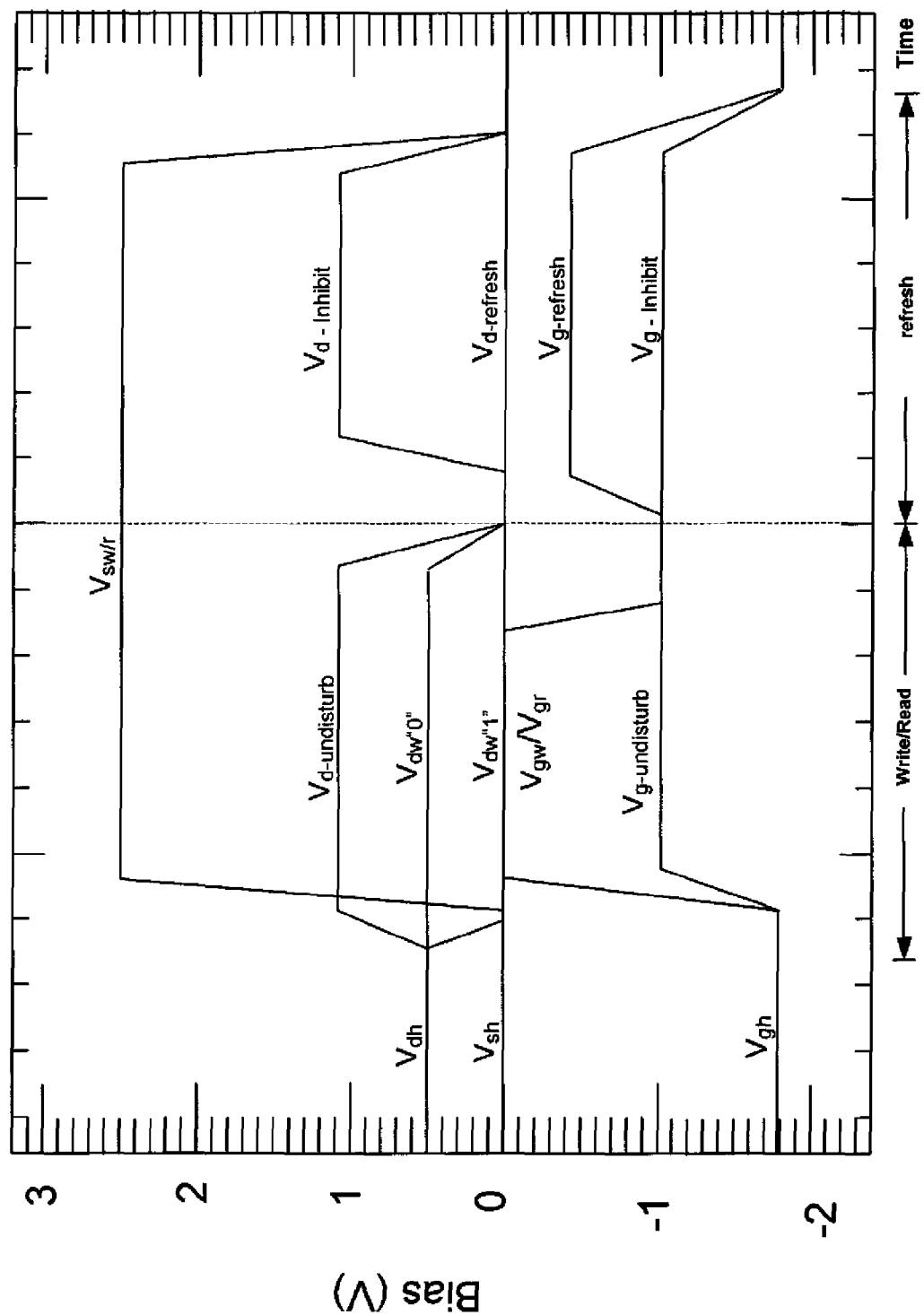
FIG. 12 shows a diagram of voltage control signals to implement a write operation, a read operation, a refresh operation and/or an inhibit operation into a memory cell in accordance with an embodiment of the present disclosure.

FIG. 12 shows a diagram of voltage control signals to implement a write operation, a read operation, a refresh operation and/or an inhibit operation into a memory cell in accordance with an embodiment of the present disclosure. FIG. 12 illustrates, a write/read phase and a refresh/inhibit phase of voltage control signals. As described above, during a write operation and/or a read operation, one or more voltage control signals may be applied to the semiconductor DRAM device 10 to implement a write operation and/or a read operation of a plurality of memory cells 12 (for example, memory cells 12a and 12e, shown in FIGS. 4 and 8) having a plurality of source lines (SL) coupled to a single source line (SL) driver.

After performing a write operation and/or a read operation of a plurality of memory cells 12 (for example, memory cells 12a and 12e, shown in FIGS. 4 and 8), it may be advantageous to employ a refresh operation to the neighboring memory cells 12. Thus, with reference to FIGS. 4 and 8, where the write operation and/or the read operation is conducted on the row of memory cells 12 associated with word line $28_i$, the neighboring rows of memory cells 12 associated with word lines $28_{i+1}$, $28_{i+2}$, $28_{i+3}$, $28_{i+4}$, $28_{i+5}$, $28_{i+6}$, and/or $28_{i+7}$, may be refreshed.

In an exemplary embodiment, the temporally varying control signals that may be implemented to refresh a plurality of memory cells 12 may include maintaining a voltage applied to the source 20 ($V_{sw/r}$) during a write operation and/or a read operation, a voltage applied to the gate 16 ($V_{g\text{-}refresh}$), and a voltage applied to the drain region 22 ($V_{d\text{-}refresh}$). For example, the source voltage ($V_{sw/r}$) applied to the source region 20 may be maintained at approximately 2.5V (via, for example, the associated source lines 30 of a sub-array of memory cells 12), a drain voltage of approximately 0V may be applied to the drain region 22 ($V_{d\text{-}refresh}$), and a gate voltage ($V_{g\text{-}refresh}$) of approximately –0.5V is applied to the gate 16.

For example, in the event that logic high (binary "1" data state) is stored in the memory cell 12, the refresh voltage may cause majority charge carriers to generate in the electrically floating body region 18 via a bipolar current and majority charge carriers may be reinforced by the refresh voltage in the electrically floating body region 18 of the memory transistor 14 of the memory cell 12. In the event that a logic low (binary "0" data state) is stored in the memory cell 12, the refresh voltage may not cause majority charge carriers to generate in the electrically floating body region 18, thus the logic low (binary "0" data state) may remain stored in the memory cell 12.

In another exemplary embodiment, the temporally varying control signals that may be implemented to inhibit a writing operation and/or a reading operation to a plurality of memory cells 12 may include maintaining the voltage applied to the source 20 ($V_{sw/r}$) during a writing operation and/or a reading operation, a voltage applied to the gate 16 ($V_{g\text{-}inhibit}$), and a voltage applied to the drain region 22 ($V_{d\text{-}inhibit}$). For example, the source voltage ($V_{sw/r}$) applied to the source region 20 may be maintained at approximately 2.5V (via, for example, the associated source lines 30 of a sub-array of memory cells 12), a drain voltage of approximately 1V may be applied to the drain region 22 ($V_{d\text{-}inhibit}$), and a gate voltage ($V_{g\text{-}inhibit}$) of approximately –1.0V may be applied to the gate 16.

Also, a sub-array of memory cells 12 (shown in FIGS. 4 and 8) of the semiconductor DRAM device 10 including a plurality of memory cells 12 may be divided into a plurality of sections. Each section of the sub-array of memory cells may include a sub-group of a plurality of source lines 30 (SL) (for example, two source lines or four source lines) associated with the sub-array of memory cells 12 coupled to a single source line (SL) driver. For example, a sub-array of memory cells 12 of the semiconductor DRAM device 10 may include eight source lines (SL) coupled to a single source line (SL) driver. Each section of the sub-array of memory cells 12 may include two source lines 30 (SL) or four source lines 30 (SL) of the eight source lines 30 (SL) of the sub-array of memory cells 12. Also, each section of the plurality of sections may perform different operations (for example, write operation, read operation, refresh operation, and/or inhibit operation). For example, a first section of the plurality of sections (for example, memory cells 12 associated with word lines (WL) $28_i$, $28_{i+1}$, $28_{i+2}$, and $28_{i+3}$) may perform a refresh function, while a second section of the plurality of sections (for example, memory cells 12 associated with word lines (WL) $28_{i+4}$, $28_{i+5}$, $28_{i+6}$, and $28_{i+7}$) may perform an inhibit function.

At this point it should be noted that simultaneously driving a plurality of source line (SL) in accordance with the present disclosure as described above typically involves the processing of input data and the generation of output data to some extent. This input data processing and output data generation may be implemented in hardware or software. For example, specific electronic components may be employed in a semiconductor DRAM device or similar or related circuitry for implementing the functions associated with simultaneously driving a plurality of source line (SL) in accordance with the present disclosure as described above. Alternatively, one or more processors operating in accordance with instructions may implement the functions associated with simultaneously driving a plurality of source lines (SL) in accordance with the present disclosure as described above. If such is the case, it is within the scope of the present disclosure that such instructions may be stored on one or more processor readable media (e.g., a magnetic disk or other storage medium), or transmitted to one or more processors via one or more signals embodied in one or more carrier waves.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An apparatus for simultaneously driving a plurality of source lines comprising:
   a plurality of source lines coupled to one or more source line drivers, wherein the plurality of source lines are divided into a plurality of sub-groups of source lines and each of the plurality of sub-groups of source lines is configured to perform different operations; and a plurality of dynamic random access memory cells arranged in an array of rows and columns, each dynamic random access memory cell including one or more memory transistors having:
- a first region coupled to a first source line of the plurality of source lines;
- a second region coupled to a bit line;
- a body region disposed between the first region and the second region, wherein the body region is electrically floating; and
- a gate coupled to a word line and spaced apart from, and capacitively coupled to, the body region.

2. The apparatus according to claim 1, wherein a total number of source lines coupled to the one or more source line drivers is based at least in part on power consumption of the plurality of dynamic random access memory cells.

3. The apparatus according to claim 1, wherein a total number of source lines coupled to the one or more source line drivers is based at least in part on disturbance on the plurality of dynamic random access memory cells.

4. The apparatus of claim 1, wherein a total number of source lines coupled to the one or more source line drivers is based at least in part on an available area on a circuit board.

5. The apparatus according to claim 1, wherein each row of the plurality of dynamic random access cells is coupled to one source line of the plurality of source lines.

6. The apparatus according to claim 1, wherein multiple rows of the plurality of dynamic random access memory cells are coupled to one source line of the plurality of source lines.

7. The apparatus according to claim 1, wherein at least one of four source lines, eight source lines, sixteen source lines, or thirty-two source lines are coupled to the one or more source line drivers.

8. The apparatus according to claim 1, wherein the different operations comprise at least one of a write operation, a read operation, a refresh operation, and an inhibit operation.

9. The apparatus according to claim 1, wherein each of the plurality of sub-groups of source lines is coupled to a respective one of the one or more source line drivers.

10. A method for simultaneously driving a plurality of source lines comprising the steps of:
coupling a plurality of source lines to one or more source line drivers, wherein the plurality of source lines are divided into a plurality of sub-groups of source lines and each of the plurality of sub-groups of source lines is configured to perform different operations; and
arranging a plurality of dynamic random access memory cells in an array of rows and columns, each dynamic random access memory cell including one or more memory transistors having:
- a first region coupled to a first source line of the plurality of source lines;
- a second region coupled to a bit line;
- a body region disposed between the first region and the second region, wherein the body region is electrically floating; and
- a gate coupled to a word line and spaced apart from, and capacitively coupled to, the body region.

11. The method according to claim 10, further comprising coupling each row of the plurality of dynamic random access cells to one source line of the plurality of source lines.

12. The method according to claim 10, further comprising coupling multiple rows of the plurality of dynamic random access memory cells to one source line of the plurality of source lines.

13. The method according to claim 10, wherein coupling a plurality of source lines to one or more source line drivers comprises coupling at least one of four source lines, eight source lines, sixteen source lines, or thirty-two source lines to the one or more source line drivers.

14. The method according to claim 10, wherein the different operations comprise at least one of a write operation, a read operation, a refresh operation, and an inhibit operation.

15. The method according to claim 10, wherein each of the plurality of sub-groups of source lines is coupled to a respective one of the one or more source line drivers.

* * * * *